United States Patent
Heo et al.

(10) Patent No.: US 12,075,654 B2
(45) Date of Patent: Aug. 27, 2024

(54) DISPLAY APPARATUS

(71) Applicant: Samsung Display Co., Ltd., Yongin-si (KR)

(72) Inventors: Kangwook Heo, Yongin-si (KR); Gunwoo Ko, Yongin-si (KR); Chiwook An, Yongin-si (KR); Hyeonbum Lee, Yongin-si (KR); Soonil Jung, Yongin-si (KR); Junghyun Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 483 days.

(21) Appl. No.: 17/505,517

(22) Filed: Oct. 19, 2021

(65) Prior Publication Data

US 2022/0285463 A1    Sep. 8, 2022

(30) Foreign Application Priority Data

Mar. 5, 2021    (KR) .................. 10-2021-0029660

(51) Int. Cl.
| H10K 59/12 | (2023.01) |
| H10K 50/84 | (2023.01) |
| H10K 50/86 | (2023.01) |
| H10K 59/38 | (2023.01) |
| H10K 77/10 | (2023.01) |

(52) U.S. Cl.
CPC .......... *H10K 59/12* (2023.02); *H10K 50/841* (2023.02); *H10K 50/865* (2023.02); *H10K 59/38* (2023.02); *H10K 77/111* (2023.02)

(58) Field of Classification Search
CPC ........ H10K 59/12; H10K 59/40; H10K 59/00; H10K 59/50; H10K 50/85; H10K 59/124
See application file for complete search history.

(56) References Cited

U.S. PATENT DOCUMENTS

| 10,340,317 | B2 | 7/2019 | Oh et al. | |
| 11,476,297 | B2 * | 10/2022 | Lee | H01L 27/156 |
| 2017/0069873 | A1 * | 3/2017 | Kim | H10K 59/88 |
| 2018/0031880 | A1 * | 2/2018 | Kwak | G06F 3/0443 |
| 2019/0296262 | A1 * | 9/2019 | Lee | H10K 50/844 |
| 2019/0348475 | A1 * | 11/2019 | Park | H10K 10/88 |
| 2020/0210005 | A1 | 7/2020 | Kim et al. | |
| 2020/0243618 | A1 * | 7/2020 | Song | H10K 59/88 |

(Continued)

FOREIGN PATENT DOCUMENTS

| KR | 10-1834792 B1 | 3/2018 |
| KR | 10-2020-0080754 A | 7/2020 |

*Primary Examiner* — Mamadou L Diallo
(74) *Attorney, Agent, or Firm* — Lewis Roca Rothgerber Christie LLP

(57) ABSTRACT

A display apparatus includes a substrate including a display area and a peripheral area adjacent to the display area, and including a bending area where at least a portion of the peripheral area is bent, a display element on the display area, a pad portion arranged on the peripheral area with the bending area between the display element and the pad portion, an input sensing layer over the display element, and an optical functional layer over the input sensing layer and including a first layer having an opening corresponding to the display element, and a second layer having a different refractive index from the first layer, and the second layer is arranged to extend to the peripheral area and cover the bending area.

25 Claims, 19 Drawing Sheets

(56) References Cited

U.S. PATENT DOCUMENTS

| | | |
|---|---|---|
| 2020/0393946 A1 | 12/2020 | Bok et al. |
| 2021/0126224 A1* | 4/2021 | Lee ..................... H10K 59/131 |
| 2021/0223940 A1* | 7/2021 | Li ...................... G06F 3/04186 |
| 2022/0263046 A1* | 8/2022 | Lee ..................... H10K 77/111 |

* cited by examiner

DISPLAY APPARATUS

CROSS-REFERENCE TO RELATED APPLICATION

This application claims priority to and the benefit of Korean Patent Application No. 10-2021-0029660, filed on Mar. 5, 2021 in the Korean Intellectual Property Office, the entire content of which is hereby incorporated by reference.

BACKGROUND

1. Field

Aspects of one or more embodiments relate to a display apparatus.

2. Description of the Related Art

Organic light-emitting display apparatuses have a larger viewing angle, better contrast characteristics, and a faster response speed than other display apparatuses, and thus have drawn attention as a next-generation display apparatus.

In general, organic light-emitting display apparatuses include a thin-film transistor and an organic light emitting diode, which is a display element, formed on a substrate, and the organic light emitting diode emits light by itself. Such organic light-emitting display apparatuses may be used as displays of small products, such as mobile phones, and may also be used as displays of large products, such as televisions.

SUMMARY

According to an aspect of one or more embodiments, a display apparatus in which stain visibility due to external light reflection is improved is provided. However, the above aspect of one or more embodiments is only an example, and the scope and aspects of the present disclosure are not limited thereto.

Additional aspects will be set forth, in part, in the description which follows and, in part, will be apparent from the description, or may be learned by practice of the presented embodiments of the disclosure.

According to one or more embodiments, a display apparatus includes a substrate including a display area and a peripheral area adjacent to the display area, and including a bending area where at least a portion of the peripheral area is bent, a display element on the display area, a pad portion arranged on the peripheral area with the bending area between the display element and the pad portion, an input sensing layer over the display element, and an optical functional layer over the input sensing layer and including a first layer having an opening corresponding to the display element, and a second layer having a different refractive index from the first layer. The second layer is arranged to extend to the peripheral area and cover the bending area.

The display apparatus may further include a control dam between the bending area and the pad portion.

An end of the second layer may not extend beyond an end of the control dam that faces the pad portion.

The control dam may include a same material as a material included in the first layer.

The control dam may include a first dam and a second dam spaced apart from each other, and a valley may be located between the first dam and the second dam.

A width of the first dam may be greater than a width of the second dam.

The first dam may include a plurality of patterns.

The display apparatus may further include a stress reduction layer arranged on the second layer corresponding to the bending area.

The stress reduction layer may include an organic insulating material.

A refractive index of the second layer may be greater than a refractive index of the first layer.

The display apparatus may further include a thin-film encapsulation layer between the display element and the input sensing layer and including at least one inorganic encapsulation layer and at least one organic encapsulation layer, and a partition wall between the display element and the bending area and configured to control the organic encapsulation layer, wherein the second layer may overlap the partition wall.

The display apparatus may further include an inorganic insulating layer on the substrate and having an opening corresponding to the bending area, a first organic layer arranged on the bending area to correspond to the opening, a connection wire on the first organic layer and configured to transmit a signal from the pad portion to the display element, and a second organic layer covering the connection wire.

An upper surface of the second layer may be inclined on the second organic layer.

The second layer may be in direct contact with an end of the input sensing layer and an end of the first layer to cover the end of the input sensing layer and the end of the first layer.

An upper surface of the second layer may be flat on the display area.

The display apparatus may further include a black matrix arranged on the peripheral area and exposing the pad portion; and a color filter between the input sensing layer and the optical functional layer. The color filter may extend toward the peripheral area to be between the black matrix and the second layer.

The optical functional layer may further include a third layer between the first layer and the color filter.

The third layer may include a same material as a material included in the first layer.

The display apparatus may further include a control dam arranged to correspond to the peripheral area between the bending area and the pad portion, and the control dam may be arranged on an edge of the color filter arranged on the black matrix.

The display apparatus may further include a black matrix arranged on the peripheral area and exposing the pad portion, and a wavelength adjustment layer between the input sensing layer and the black matrix to correspond to the display area.

The display apparatus may further include a control dam arranged to correspond to the peripheral area between the bending area and the pad portion, and the control dam may be arranged on an edge of the black matrix.

The second layer may be in direct contact with the black matrix, on the peripheral area.

The wavelength adjustment layer may extend toward the peripheral area to be between the black matrix and the second layer.

The display apparatus may further include a control dam arranged to correspond to the peripheral area between the bending area and the pad portion, and the control dam may be arranged on an edge of the wavelength adjustment layer.

The second layer may be in direct contact with the wavelength adjustment layer, on the peripheral area.

These and/or other aspects will become apparent and more readily appreciated from the following description of some embodiments, taken in conjunction with the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
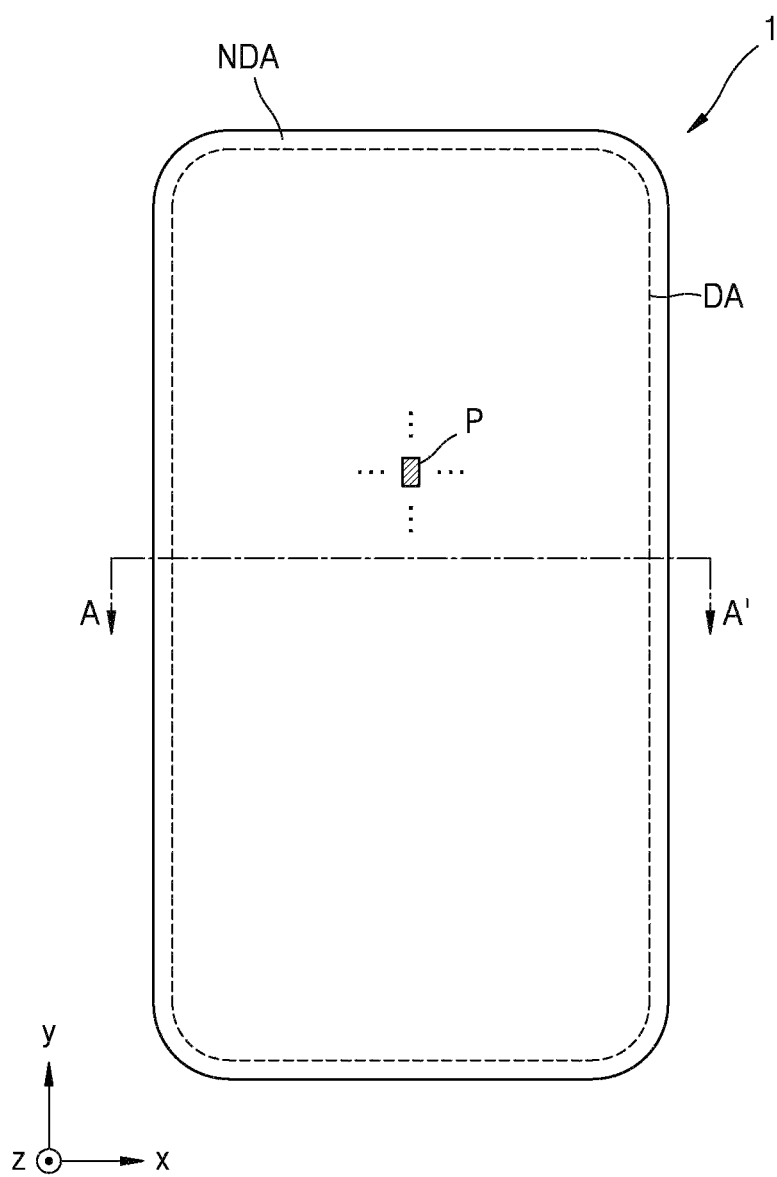
FIG. 1 is a schematic plan view of a portion of a display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the present disclosure allows for various changes and numerous embodiments, some particular embodiments will be illustrated in the drawings and described in further detail in the written description. Herein, effects and features of the present disclosure and methods for accomplishing them will be described more fully with reference to the accompanying drawings, in which some embodiments of the present disclosure are shown. The present disclosure may, however, be embodied in many different forms and should not be construed as limited to the embodiments set forth herein.

One or more embodiments of the present disclosure will be described below in further detail with reference to the accompanying drawings. Those components that are the same as or are in correspondence with each other are rendered the same reference numeral regardless of the figure number, and redundant explanations may be omitted.

It is to be understood that although the terms "first," "second," etc. may be used herein to describe various components, these components should not be limited by these terms. These components are used to distinguish one component from another.

As used herein, the singular forms "a," "an," and "the" are intended to include the plural forms as well, unless the context clearly indicates otherwise.

The terms "comprises" and/or "comprising" used herein specify the presence of stated features or components, but do not preclude the presence or addition of one or more other features or components.

When a layer, region, or component is referred to as being "formed on" another layer, region, or component, it may be directly or indirectly formed on the other layer, region, or component. That is, for example, one or more intervening layers, regions, or components may be present.

When a layer, region, or component is referred to as being "connected" or "coupled" to another layer, region, or component, it may be directly connected or coupled to the other layer, region, and/or component, or one or more intervening layers, regions, or components may be present. For example, when a layer, region, or component is referred to as being "electrically connected" or "electrically coupled" to another layer, region, or component, it may be directly electrically connected or coupled to the other layer, region, and/or component or one or more intervening layers, regions, or components may be present.

In the present specification, "A and/or B" represents A or B, or A and B. The expression "at least one of A and B" indicates only A, only B, both A and B, or variations thereof.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. For example, since sizes and thicknesses of components in the drawings may be arbitrarily illustrated for convenience of explanation, embodiments of the disclosure are not limited thereto.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

FIG. 1 is a schematic plan view of a portion of a display apparatus 1 according to an embodiment.

Referring to FIG. 1, the display apparatus 1 includes a display area DA, and a peripheral area NDA outside the display area DA. A plurality of pixels P including a display element are arranged in the display area DA, and the display apparatus 1 may provide an image by using light that is emitted by the plurality of pixels P arranged in the display area DA. The peripheral area NDA is a non-display area where no display elements are arranged, and, in an embodiment, the display area DA may be entirely surrounded by the peripheral area NDA.

Although FIG. 1 illustrates the display apparatus 1 including a flat display surface, embodiments of the disclosure are not limited thereto. According to another embodiment, the display apparatus 1 may include a three-dimensional display surface or a curved display surface.

When the display apparatus 1 includes a three-dimensional display surface, the display apparatus 1 may include a plurality of display areas facing in different directions and, for example, may include a display surface in the form of a polyprism. According to another embodiment, when the display apparatus 1 includes a curved display surface, the display apparatus 1 may be implemented in various types, such as flexible, foldable, and rollable display apparatuses.

According to an embodiment, FIG. 1 illustrates a display apparatus 1 applicable to mobile phones. Although now shown, electronic modules, a camera module, a power supply module, and the like mounted on a main board may be arranged in a bracket/case or the like together with the display apparatus 1, thereby constituting a mobile phone. The display apparatus 1 according to an embodiment is applicable to not only large-sized electronic apparatuses, such as televisions and monitors, but also small- and medium-sized electronic apparatuses, such as tablets, automobile navigation devices, game players, and smart watches.

FIG. 1 illustrates a case in which the display area DA of the display apparatus 1 has a shape of a rectangle with rounded corners. However, according to another embodiment, the shape of the display area DA may be a circle, an oval, or a polygon, such as a triangle or a pentagon.

Although an organic light-emitting display apparatus will now be illustrated and described as the display apparatus 1 according to an embodiment of the disclosure, embodiments are not limited thereto. According to another embodiment, the display apparatus 1 may be an inorganic light-emitting display, a quantum dot light-emitting display, or the like. For example, an emission layer of a display element included in the display apparatus 1 may include an organic material, an inorganic material, quantum dots, an organic material and quantum dots, or an inorganic material and quantum dots.

Figure 2A:
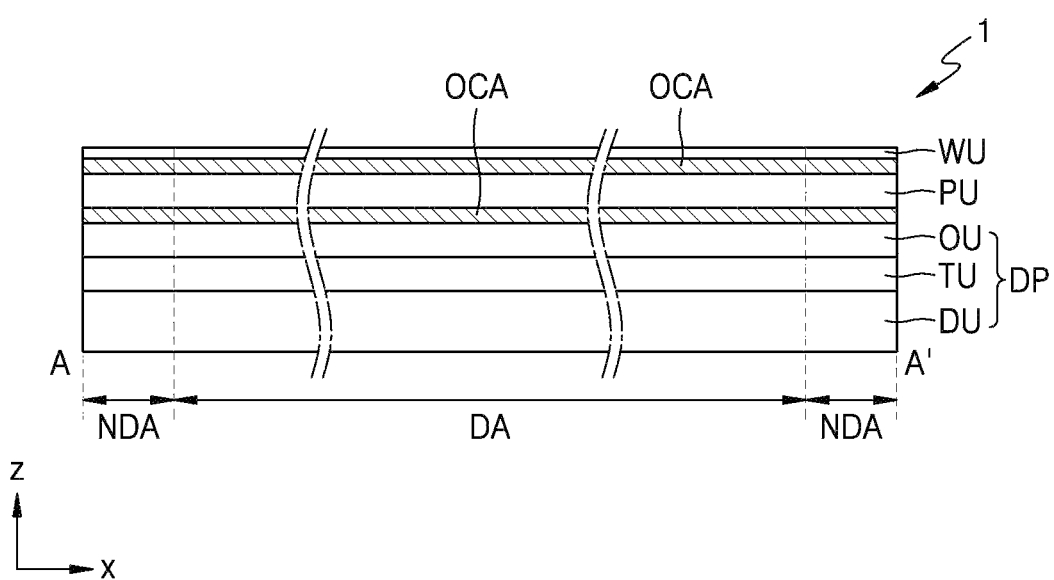
FIGS. 2A and 2B are schematic cross-sectional views of the display apparatus of FIG. 1, taken along the line A-A' of FIG. 1, according to embodiments.
Figure 2B:
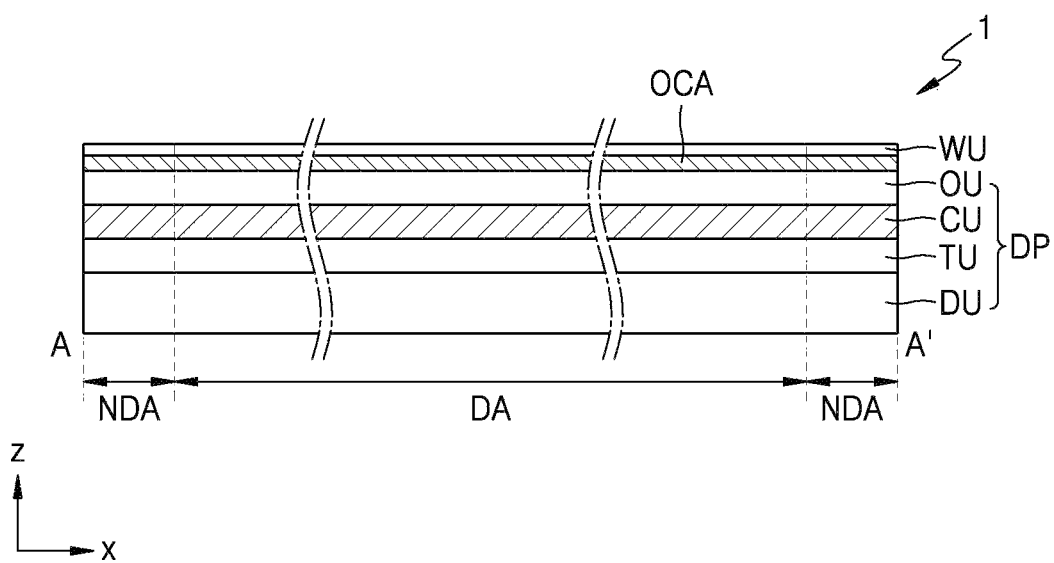
Figure 3:
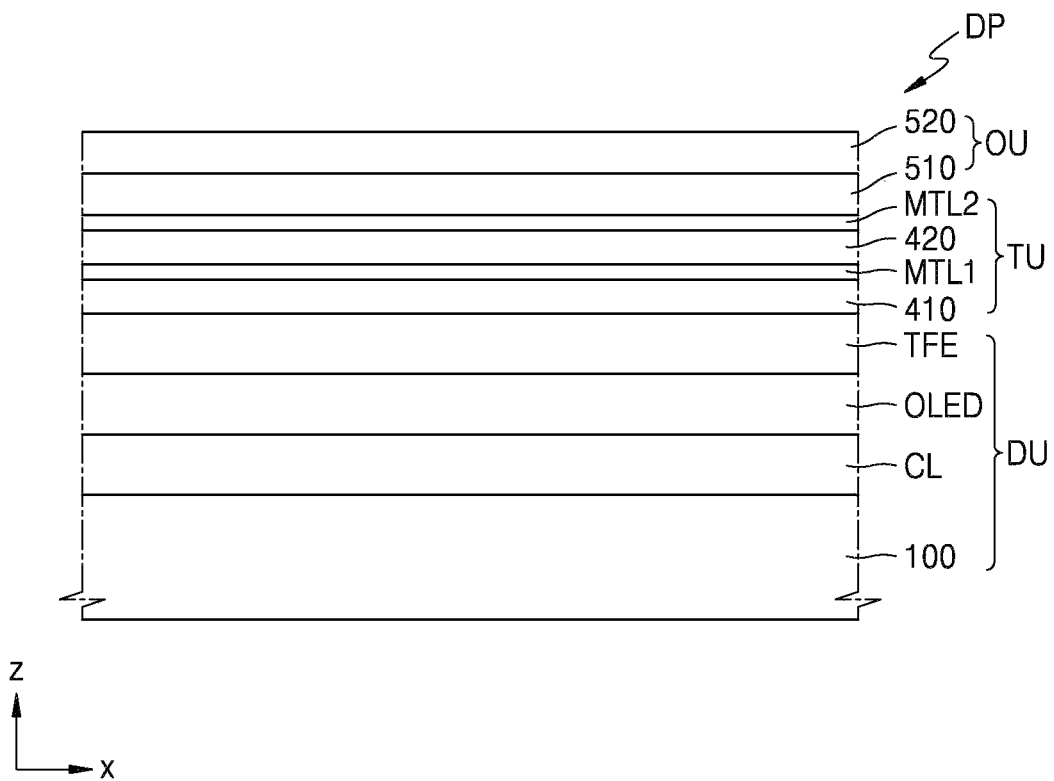
FIG. 3 is a schematic cross-sectional view of a portion of a display panel of a display apparatus according to an embodiment.

FIGS. 2A and 2B are schematic cross-sectional views of the display apparatus 1 of FIG. 1 taken along the line A-A'; and FIG. 3 is a schematic cross-sectional view of a portion of a display panel of the display apparatus 1 according to an embodiment.

FIGS. 2A, 2B, and 3 are simplified cross-sectional views for explaining a stacking relationship between a functional panel and/or functional layers that constitute the display apparatus 1.

Referring to FIG. 2A, the display apparatus 1 according to an embodiment may include a display layer DU, an input sensing layer TU, an optical functional layer OU, a polarization layer PU, and a window layer WU. At least some components from among the display layer DU, the input sensing layer TU, the optical functional layer OU, the polarization layer PU, and the window layer WU may be formed by consecutive processes or may be combined with each other via an adhesion member. FIG. 2A illustrates an optically clear adhesion member OCA as the adhesion member. An adhesion member to be described herein may include a typical adhesive. According to an embodiment, the polarization layer PU and the window layer WU may be replaced by other components or may be omitted.

According to an embodiment, the input sensing layer TU is arranged directly on the display layer DU. In the present specification, "a component B is arranged directly on a component A" means that there are no adhesion layers/adhesion members arranged between the components A and B. The component B may be formed on a base surface of the component A via a consecutive process after the component A is formed.

In an embodiment, the display layer DU, the input sensing layer TU arranged directly on the display layer DU, and the optical functional layer OU may be defined as a display panel DP. According to an embodiment, as shown in FIG. 2A, optically clear adhesion members OCA may be arranged between the display panel DP and the polarization layer PU and between the polarization layer PU and the window layer WU, respectively.

According to another embodiment, as shown in FIG. 2B, the display panel DP may include a color filter layer CU. The color filter layer CU may be arranged between the input sensing layer TU and the optical functional layer OU. The color filter layer CU may include a color filter included to correspond to a light-emission area of each pixel P, and a light-shielding layer included to correspond to a non-light-emission area between pixels P. According to an embodiment, no optically clear adhesion members OCA may be between the color filter layer CU and the display panel DP, and the color filter layer CU may be directly on the display panel DP.

The display layer DU generates an image, and the input sensing layer TU obtains coordinate information of an external input (for example, a touch event). Although not illustrated separately, the display panel DP according to an embodiment may further include a protection member arranged on a lower surface of the display layer DU. In an embodiment, the protection member and the display layer DU may be combined with each other via an adhesion member.

The optical functional layer OU may improve light efficiency. The optical functional layer OU may improve, for example, front light efficiency and/or side visibility of light that is emitted by an organic light-emitting diode OLED.

The polarization layer PU reduces reflectivity of external light that is incident thereon from the top of the window layer WU. The polarization layer PU according to an embodiment may include a phase retarder and a polarizer. The phase retarder may be of a film type or liquid coating type, and may include a $\lambda/2$ phase retarder and/or a $\lambda/4$ phase retarder. The polarizer may also be of a film type or liquid coating type. The film type may include a stretchable synthetic resin film, and the liquid coating type may include liquid crystals arranged in a certain arrangement. The phase retarder and the polarizer may further include protective films, respectively. The phase retarder and the polarizer, or the protective films may be defined as a base layer of the polarization layer PU.

The display layer DU, the input sensing layer TU, and the optical functional layer OU will now be described in further detail with reference to FIG. 3.

Referring to FIG. 3, the display panel DP includes the display layer DU and the input sensing layer TU. The display layer DU and the input sensing layer TU are illustrated to explain a stacking structure of the display panel DP. The polarization layer PU of FIG. 2A and the window layer WU of FIG. 2A, which may be arranged on the input sensing layer TU, are not illustrated.

Figure 6:
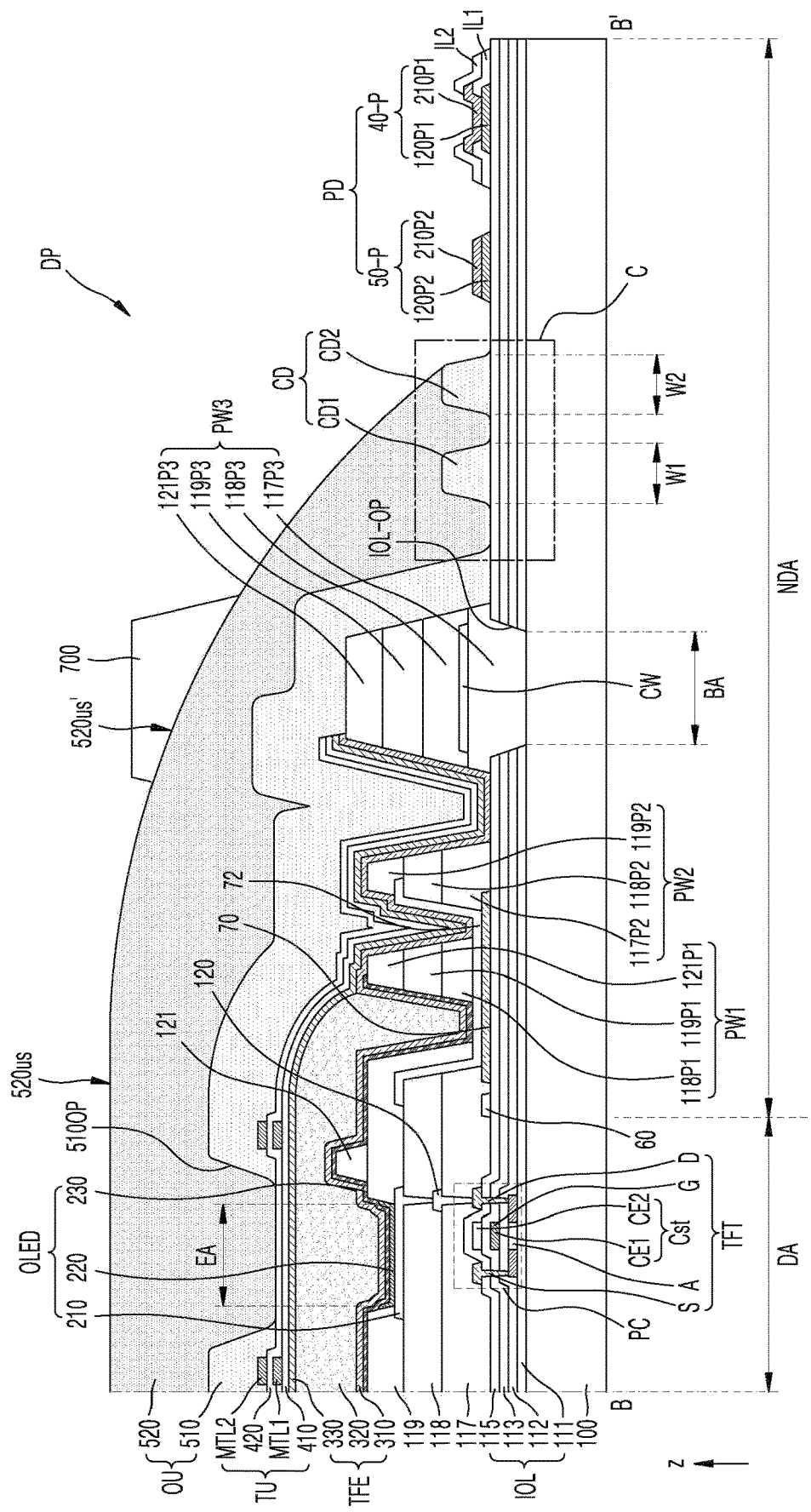
FIG. 6 is a schematic cross-sectional view of a portion of the display panel of FIG. 5, taken along the line B-B' of FIG. 5, according to an embodiment.

In an embodiment, the display layer DU may be obtained by sequentially arranging a circuit layer CL, an organic light-emitting diode OLED, and a thin-film encapsulation layer TFE on a substrate 100. In an embodiment, the input sensing layer TU may be arranged directly on the thin-film encapsulation layer TFE. The thin-film encapsulation layer TFE includes at least one organic encapsulation layer 320 as shown in FIG. 6, which will be described later, and thus may provide a flatter base surface. Accordingly, even when the components of the input sensing layer TU, which will be described later, are formed by consecutive processes, a defect rate may be reduced.

The input sensing layer TU may have a multi-layered structure. The input sensing layer TU includes a detection electrode, a signal line (or trace line) connected to the detection electrode, and at least one insulating layer. The input sensing layer TU may detect an external input according to, for example, an electrostatic capacitive method. An operation method of the input sensing layer TU is not particularly limited according to the present disclosure. According to an embodiment, the input sensing layer TU may sense an external input according to an electromagnetic induction method or a pressure detection method.

As shown in FIG. 3, the input sensing layer TU according to an embodiment may include a first inorganic insulating layer 410, a first conductive layer MTL1, a second inorganic insulating layer 420, and a second conductive layer MTL2.

For example, each of the first conductive layer MTL1 and the second conductive layer MTL2 may have a single-layered structure or a stacked multi-layered structure. A conductive layer having a single-layered structure may include a metal layer or a transparent conductive layer. In an embodiment, the metal layer may include any of molybdenum, silver, titanium, copper, aluminum, and an alloy thereof. In an embodiment, the transparent conductive layer may include a transparent conductive oxide, such as indium tin oxide (ITO), indium zinc oxide (IZO), zinc oxide (ZnO), or indium tin zinc oxide (ITZO). In another embodiment, the transparent conductive layer may include a conductive polymer (e.g., poly-(3,4)-ethylene-dihydroxy thiophene (PE-DOT)), metal nano wires, graphene, or the like.

A conductive layer having a multi-layered structure may include a plurality of metal layers. The plurality of metal layers may have, for example, a three-layered structure of titanium/aluminum/titanium (Ti/Al/Ti). The conductive layer having a multi-layered structure may include at least one metal layer and at least one transparent conductive layer.

Each of the first conductive layer MTL1 and the second conductive layer MTL2 includes a plurality of patterns. It may be herein understood that the first conductive layer MTL1 includes first conductive patterns, and that the second conductive layer MTL2 includes second conductive patterns. The first conductive patterns and the second conductive patterns may form a detection electrode shown in FIG. 6. According to an embodiment, the detection electrode may have a mesh shape, as will be described later with reference to FIG. 6, which prevents or substantially prevents visual recognition of a detection electrode by a user.

Each of the first inorganic insulating layer 410 and the second inorganic insulating layer 420 may have a single-layered or multi-layered structure. Each of the first inorganic insulating layer 410 and the second inorganic insulating layer 420 may include an inorganic material or a composite material. For example, at least one of the first inorganic insulating layer 410 and the second inorganic insulating layer 420 may include an inorganic layer. In an embodiment, the inorganic layer may include at least one of aluminum oxide, titanium oxide, silicon oxide, silicon oxynitride, zirconium oxide, and hafnium oxide. According to another embodiment, the first inorganic insulating layer 410 and/or the second inorganic insulating layer 420 may be replaced by an organic insulating layer.

The optical functional layer OU may be directly on the input sensing layer TU. The optical functional layer OU may include a first layer 510, and a second layer 520 on the first layer 510. The first layer 510 and the second layer 520 may include an organic insulating material, and may be included to have different refractive indexes. According to an embodiment, the refractive index of the second layer 520 may be greater than that of the first layer 510.

Figure 4:
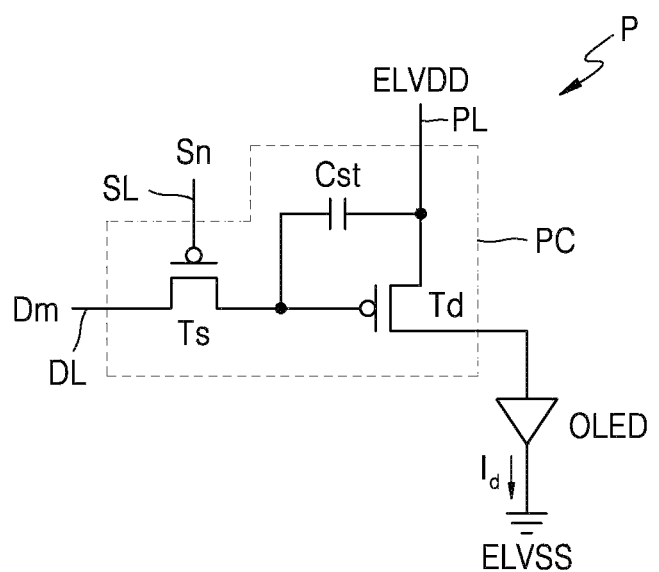
FIG. 4 is an equivalent circuit diagram of a pixel that may be included in a display apparatus according to an embodiment.

FIG. 4 is an equivalent circuit diagram of a pixel P that may be included in the display apparatus 1 according to an embodiment.

Referring to FIG. 4, each pixel P includes a pixel circuit PC connected to a scan line SL and a data line DL, and an organic light-emitting diode OLED connected to the pixel circuit PC.

The pixel circuit PC includes a driving thin-film transistor Td, a switching thin-film transistor Ts, and a storage capacitor Cst. The switching thin-film transistor Ts is connected to the scan line SL and the data line DL, and transmits, to the driving thin-film transistor Td, a data signal Dm received via the data line DL according to a scan signal Sn received via the scan line SL.

The storage capacitor Cst is connected to the switching thin-film transistor Ts and a driving voltage line PL, and stores a voltage corresponding to a difference between a voltage received from the switching thin-film transistor Ts and a driving voltage ELVDD supplied to the driving voltage line PL.

The driving thin-film transistor Td is connected to the driving voltage line PL and the storage capacitor Cst, and may control a driving current $I_d$ flowing from the driving voltage line PL to the organic light-emitting diode OLED, in accordance with a voltage value stored in the storage capacitor Cst. The organic light-emitting diode OLED may emit light having a certain brightness according to the driving current $I_d$.

Although a case in which the pixel circuit PC includes two thin-film transistors and one storage capacitor is illustrated in FIG. 4, embodiments of the present disclosure are not limited thereto. According to another embodiment, the pixel circuit PC may include seven thin-film transistors and one storage capacitor. According to another embodiment, the pixel circuit PC may include two or more storage capacitors.

Figure 5:
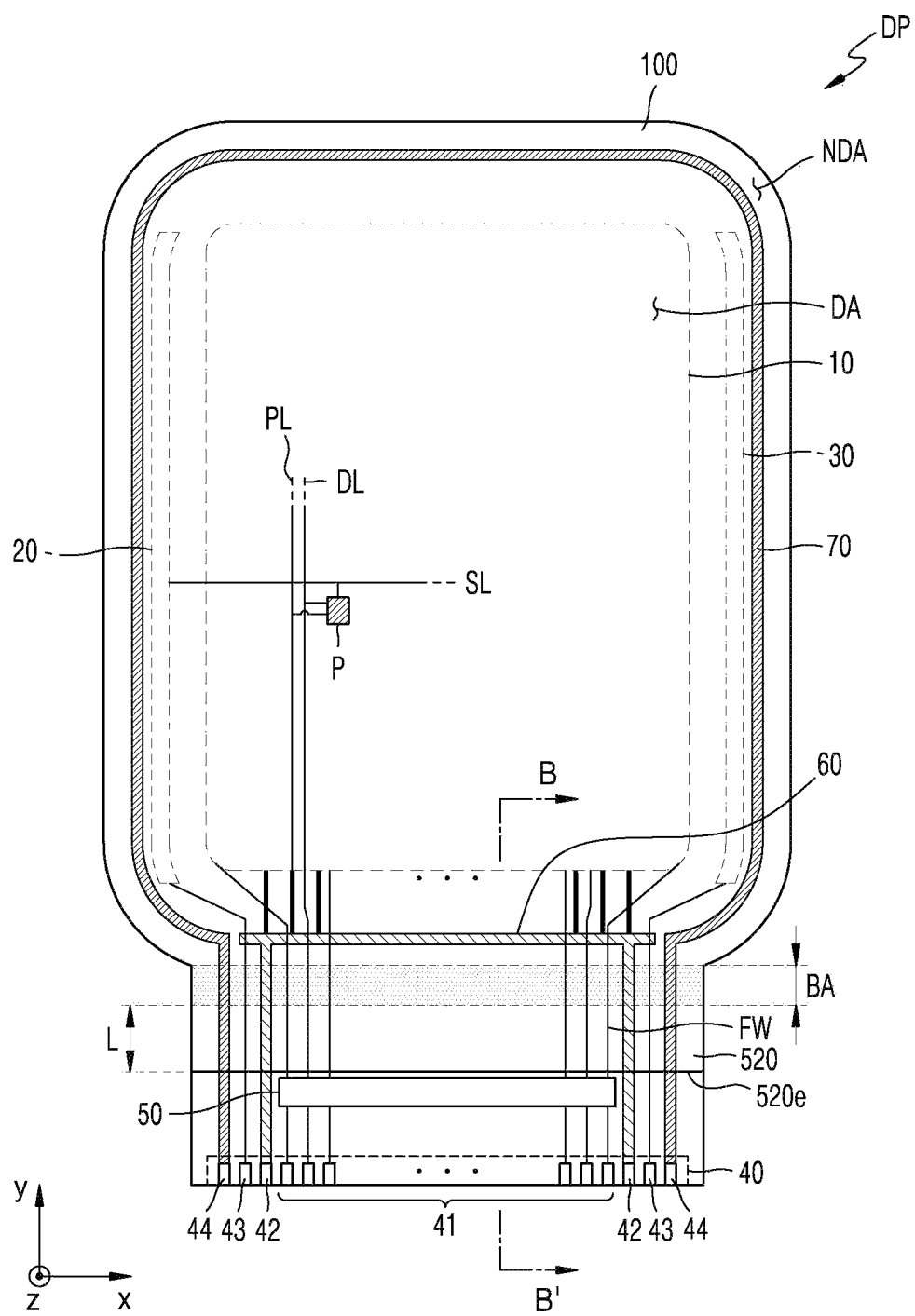
FIG. 5 is a schematic plan view of a display panel of the display apparatus of FIG. 1.

FIG. 5 is a schematic plan view of the display panel DP of the display apparatus 1 of FIG. 1.

Referring to FIG. 5, the display panel DP according to an embodiment includes a display unit 10, first and second scan driving units 20 and 30, a terminal portion 40, a data driving unit 50, a driving voltage supply line 60, and a common voltage supply line 70 arranged on the substrate 100.

Although not shown in FIG. 4, an emission-control driving unit (not shown) may be further arranged on a side of the first scan driving unit 20.

The substrate 100 may include a material, such as a glass material, a metal, or an organic material. According to an embodiment, the substrate 100 may be formed of a flexible material. For example, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate.

In an embodiment, the substrate 100 may have a multi-layered structure including two layers each including a polymer resin and a barrier layer including an inorganic material (silicon oxide, silicon nitride, silicon oxynitride, or the like) between the two layers. In this way, various modifications may be made.

The substrate 100 may include the display area DA and the peripheral area NDA surrounding the display area DA. A portion of the peripheral area NDA may extend to a side (e.g., a -y direction). The terminal portion 40, the data driving unit 50, the driving voltage supply line 60, fanout wires FW, and the like may be located on the extending peripheral area NDA. The substrate 100 may include a bending area BA in correspondence with a portion of the peripheral area NDA. For example, the bending area BA may be a portion of the extending peripheral area NDA. The bending area BA is bendable such that the extending peripheral area NDA overlaps a portion of the display area DA, and thus a width of the peripheral area NDA that is visually recognized by a user may be reduced.

The display unit 10 is located on the display area DA, and includes a scan line SL extending in a first direction (e.g., an x direction), a data line DL extending in a second direction (e.g., a y direction) intersecting with the first direction (e.g., the x direction), and pixels P connected to the driving voltage line PL. Each of the pixels P may emit, for example, red, green, blue, or white light, and may include, for example, an organic light-emitting diode.

The display unit 10 provides a certain image via light emitted from the pixels P, and the display area DA is defined by the pixels P. The display unit 10 may generally have a shape of a rectangle. However, according to various embodiments, the display unit 10 may have, for example, a shape of a polygon, a circle, an oval, or a shape corresponding to a portion of a polygon, a circle, or an oval. According to an embodiment, the display unit 10 may include a corner portion that generally has a rectangular shape having rounded edges. The substrate 100, on which the display unit 10 is located, may have outer edges of which at least portions are curved.

The first and second scan driving units 20 and 30 are arranged on the peripheral area NDA of the substrate 100, and generate and transmit scan signals to each of the pixels P via the scan line SL. For example, the first scan driving unit 20 may be located on the left side of the display unit 10 and the second scan driving unit 30 may be located on the right side of the display unit 10. According to an embodiment, the first and second scan driving units 20 and 30 are arranged on both sides of the display unit 10, respectively. However, according to another embodiment, a scan driving unit may be arranged on only one side of the display unit 10.

A pad portion PD of FIG. 6 may be located on a side of the display area DA. The pad portion PD may be located on the peripheral area NDA of the substrate 100. The pad portion PD may include first pads 40-P and second pads 50-P of FIG. 6 for contacting the terminal portion 40 and the data driving unit 50.

The terminal portion 40 is located on an end of the substrate 100 and includes a plurality of terminals 41, 42, 43, and 44. The terminal portion 40 may be exposed without being covered with an insulating layer, and may be electrically connected to a controller such as a flexible printed circuit board or an integrated circuit (IC) chip.

The data driving unit 50 is on the peripheral area NDA of the substrate 100, and generates and transmits a data signal to each of the pixels P via the data line DL. The data driving unit 50 may be on a side of the display unit 10, for example, between the terminal portion 40 and the display unit 10. The second pads 50-P for contacting the data driving unit 50 may be located on the substrate 100, and the data driving unit 50 may transmit a data signal to the display panel DP by contacting the second pads 50-P. FIG. 5 illustrates an arrangement of the data driving unit 50 on the substrate 100 according to an embodiment. However, according to another embodiment, the data driving unit 50 may be included on the flexible printed circuit board that contacts the terminal portion 40.

The controller changes a plurality of image signals received from an external source into a plurality of image data signals, and transmits the plurality of image data signals to the data driving unit 50 via the terminal 41. The data driving unit 50 may generate a data signal, and the generated data signal may be transmitted to the display area DA via the fanout wires FW. The controller may receive a vertical synchronization signal, a horizontal synchronization signal, and a clock signal to generate a control signal for controlling driving of the first and second scan driving units 20 and 30, and may transmit the generated control signal to the first and second scan driving units 20 and 30 via the terminal 43. The controller transmits a driving voltage ELVDD and a common voltage ELVSS to the driving voltage supply line 60 and the common voltage supply line 70 via the terminals 42 and 44, respectively.

The driving voltage supply line 60 is on the peripheral area NDA. For example, the driving voltage supply line 60 may be between the data driving unit 50 and the display unit 10. The driving voltage supply line 60 provides the driving voltage ELVDD to the pixels P. The driving voltage supply line 60 may extend in the first direction (e.g., the x direction), and may be connected to the plurality of driving voltage lines PL each extending in the second direction (e.g., the y direction).

The common voltage supply line 70 is arranged on the peripheral area NDA, and provides the common voltage ELVSS to an opposite electrode 230 of FIG. 6 of an organic light-emitting diode of each pixel P. For example, the common voltage supply line 70 has a loop shape of which one side is open, and accordingly may extend along an edge of the substrate 100 with the exception of the terminal portion 40.

The optical functional layer OU may be on the display area DA. In an embodiment, the optical functional layer OU may be over the entire surface of the display area DA and may partially extend to the peripheral area NDA. Substantially, the optical functional layer OU is arranged on the input sensing layer TU of FIGS. 2A and 3, and may improve luminescent efficiency and side visibility of the pixel P on the display area DA.

In an embodiment, the optical functional layer OU may be arranged on the entire surface of the display area DA, and may partially extend to the peripheral area NDA. The second layer 520 of the optical functional layer OU may extend toward the peripheral area NDA. According to an embodiment, the second layer 520 may extend toward the peripheral area NDA so as to overlap the bending area BA of the substrate 100.

The second layer 520 may extend over the peripheral area NDA while covering the bending area BA, and may not overlap the data driving unit 50. An end 520e of the second layer 520 may be located between the bending area BA and the data driving unit 50. In an embodiment, when the second layer 520 extends over the peripheral area NDA, the end 520e of the second layer 520 may be included maximally adjacent to the data driving unit 50 in order to sufficiently secure a width L extending from the bending area BA. For example, the width L between the bending area BA and the end 520e of the second layer 520 is secured by at least about 1 mm, for example, about 4 mm to about 5 mm.

FIG. 6 is a schematic cross-sectional view of a portion of a display panel of a display apparatus according to an embodiment. FIG. 6 corresponds to a cross-section of the display panel DP taken along the line B-B' of FIG. 5.

A structure on the display area DA will be first described with reference to FIG. 6.

A buffer layer 111 may be arranged on the substrate 100. The buffer layer 111 may prevent or substantially prevent flowing of impurities into various components arranged on the substrate 100 via the substrate 100.

The pixel circuit PC including a thin-film transistor TFT and the storage capacitor Cst may be arranged on the buffer layer 111. The thin-film transistor TFT may include a semiconductor layer A, a gate electrode G overlapping a channel region of the semiconductor layer A, and a source electrode S and a drain electrode D respectively connected to a source region and a drain region of the semiconductor layer A. A gate insulating layer 112 may be between the semiconductor layer A and the gate electrode G, and a first interlayer insulating layer 113 and a second interlayer insulating layer 115 may be between the gate electrode G and the source electrode S or between the gate electrode G and the drain electrode D, respectively.

The storage capacitor Cst and the thin-film transistor TFT may overlap each other. The storage capacitor Cst may include a first capacitor plate CE1 and a second capacitor plate CE2 overlapping each other. According to an embodiment, the gate electrode G of the thin-film transistor TFT may be integrally formed with the first capacitor plate CE1 of the storage capacitor Cst. The first interlayer insulating layer 113 may be between the first capacitor plate CE1 and the second capacitor plate CE2.

The semiconductor layer A may include the channel region, and the source region and the drain region doped with impurities. According to an embodiment, the semiconductor layer A may include a silicon semiconductor material. According to an embodiment, the semiconductor layer A may include polysilicon or amorphous silicon. According to an embodiment, the semiconductor layer A may include an oxide semiconductor material. According to an embodiment, a plurality of thin-film transistors TFT may be included in the pixel circuit PC, some of the plurality of thin-film transistors TFT may include a silicon semiconductor material, and the other thin-film transistors TFT may include an oxide semiconductor material. When the semiconductor layer A includes an oxide semiconductor material, the semiconductor layer A may include oxide of at least one material selected from the group consisting of indium (In), gallium (Ga), tin (Sn), zirconium (Zr), hafnium (Hf), titanium (Ti), and zinc (Zn).

The gate insulating layer 112 may include an inorganic insulating material, such as silicon oxide, silicon oxynitride, or silicon nitride, and may be a single layer or multiple layers including the inorganic insulating material.

The gate electrode GE or the first capacitor plate CE1 may include a low-resistance conductive material, such as molybdenum (Mo), aluminum (Al), copper (Cu), and/or titanium (Ti), and may have a multi-layer or single layer structure including any of the aforementioned materials.

The first interlayer insulating layer 113 may include an inorganic insulating material, such as silicon oxide, silicon oxynitride, or silicon nitride, and may be a single layer or multiple layers including the inorganic insulating material.

The second capacitor plate CE2 may include aluminum (Al), chromium (Cr), molybdenum (Mo), titanium (Ti), tungsten (W), and/or copper (Cu), and may have a single layer or multi-layer structure including any of the aforementioned materials.

The second interlayer insulating layer 115 may include an inorganic insulating material, such as silicon oxide, silicon oxynitride, or silicon nitride, and may be a single layer or multiple layers including the inorganic insulating material.

The source electrode S or the drain electrode D may include aluminum (Al), molybdenum (Mo), titanium (Ti), tungsten (W), and/or copper (Cu), and may have a single layer or multi-layer structure including any of the aforementioned materials. For example, the source electrode S or the drain electrode D may have a three-layered structure of Ti layer/Al layer/Ti layer.

A first planarization insulating layer 117 may include a different material from at least one inorganic insulating layer IOL arranged therebelow, for example, the buffer layer 111, the gate insulating layer 112, the first interlayer insulating layer 113, and the second interlayer insulating layer 115. In an embodiment, the first planarization insulating layer 117 may include an organic insulating material, such as acryl, benzocyclobutene (BCB), polyimide, or hexamethyldisiloxane (HMDSO).

A second planarization insulating layer 118 may be located on the first planarization insulating layer 117. The second planarization insulating layer 118 may include an organic insulating material, such as acryl, benzocyclobutene (BCB), polyimide, or hexamethyldisiloxane (HMDSO). A contact metal 120 may be arranged on the first planarization insulating layer 117, and the thin-film transistor TFT and a pixel electrode 210 may be electrically connected to each other via the contact metal 120.

The pixel electrode 210 may be located on the second planarization insulating layer 118. In an embodiment, the pixel electrode 210 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. The pixel electrode 210 may include a reflective layer including the aforementioned material, and a transparent conductive layer arranged above and/or below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the pixel electrode 210 may have a three-layered structure of ITO/Ag/ITO layers that are sequentially stacked.

A pixel defining layer 119 may cover an edge of the pixel electrode 210 and may include an opening through which a center of the pixel electrode 210 is exposed. The pixel defining layer 119 may include an organic insulating material, such as benzocyclobutene (BCB), polyimide, or hexamethyldisiloxane (HMDSO). An emission area EA may be defined through the opening of the pixel defining layer 119, and red, green, or blue light may be emitted through the emission area EA. The area or width of the emission area EA may define the area or width of each pixel.

A spacer 121 may be formed on the pixel defining layer 119. The spacer 121 may prevent or substantially prevent layers below the spacer 121 from being damaged by a mask in a process of forming an intermediate layer 220 and the like, which will be described later. According to an embodiment, the spacer 121 may include a same material as the material included in the pixel defining layer 119, or may include a different material from the material included in the pixel defining layer 119. For example, when the spacer 121 includes the same material as the material included in the pixel defining layer 119, the spacer 121 may be integrally formed with the pixel defining layer 119 through a half-tone mask.

The intermediate layer 220 includes an emission layer that overlaps the pixel electrode 210. The emission layer may include an organic material. The emission layer may include a low-molecular or high-molecular weight organic material that emits light of a certain color. As described above, the emission layer may be formed via a deposition process using a mask.

A first functional layer and a second functional layer may be arranged below and/or above the emission layer, respectively. According to an embodiment, in contrast with the emission layer being patterned and arranged for each pixel, the first functional layer and the second functional layer may be integrally formed over the entire surface of the display area DA.

The first functional layer may be a single layer or a multi-layer. For example, when the first functional layer includes a high-molecular weight material, the first functional layer is a hole transport layer (HTL) having a single-layered structure, and may include poly-(3,4)-ethylene-dihydroxy thiophene (PEDOT) and/or polyaniline (PANI). When the first functional layer includes a low-molecular weight material, the first functional layer may include a hole injection layer (HIL) and an HTL.

The second functional layer may be optional. For example, when the first functional layer and the emission layer include a high-molecular weight material, the second functional layer may be formed. The second functional layer may be a single layer or a multi-layer. The second functional layer may include an electron transport layer (ETL) and/or an electron injection layer (EIL).

An opposite electrode 230 may include a conductive material having a relatively low work function. For example, the opposite electrode 230 may include a (semi)transparent layer including, for example, silver (Ag), magnesium (Mg), aluminum (Al), nickel (Ni), chromium (Cr), lithium (Li), calcium (Ca), or an alloy of these materials. In another embodiment, the opposite electrode 230 may further include a layer, such as ITO, IZO, ZnO, or $In_2O_3$, on the (semi)transparent layer including any of the above-described materials. According to an embodiment, the opposite electrode 230 may include any of Ag and Mg.

The pixel electrode 210, the intermediate layer 220, and the opposite electrode 230 sequentially stacked on one another may form a light-emitting diode, for example, an organic light-emitting diode OLED. A display layer including the pixel circuit PC, the insulating layers, and the organic light-emitting diode OLED may be covered with the thin-film encapsulation layer TFE.

The thin-film encapsulation layer TFE may include first and second inorganic encapsulation layers 310 and 330 and an organic encapsulation layer 320 therebetween.

Each of the first and second inorganic encapsulation layers 310 and 330 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. In an embodiment, the first and second inorganic encapsulation layers 310 and 330 may be formed by CVD.

In an embodiment, the organic encapsulation layer 320 may include a polymer-based material. Examples of the polymer-based material may include an acrylic resin, an epoxy-based resin, polyimide, and polyethylene. For example, the organic encapsulation layer 320 may include an acrylic resin, for example, polymethyl methacrylate or polyacrylic acid. The organic encapsulation layer 320 may be formed by curing a monomer or by coating a polymer.

In an embodiment, the thin-film encapsulation layer TFE may entirely cover the display area DA, and extend toward the peripheral area NDA to cover a portion of the peripheral area NDA. The thin-film encapsulation layer TFE may extend to the outside of the driving voltage supply line 60.

The input sensing layer TU may include a first conductive layer MTL1 and a second conductive layer MTL2 each including, for example, a detection electrode and/or a trace line. The first insulating layer 410 may be between the thin-film encapsulation layer TFE and the first conductive layer MTL1, and the second insulating layer 420 may be between the first conductive layer MTL1 and the second conductive layer MTL2.

Each of the first conductive layer MTL1 and the second conductive layer MTL2 may include a conductive material. The conductive material may include molybdenum (Mo), aluminum (Al), copper (Cu), and/or titanium (Ti) and may have a multi-layered or single-layered structure including any of the aforementioned materials. According to some embodiments, each of the first conductive layer MTL1 and the second conductive layer MTL2 may have a Ti/Al/Ti structure in which a Ti layer, an Al layer, and a Ti layer are sequentially stacked on one another.

Each of the first and second insulating layers 410 and 420 may include an inorganic insulating material and/or an organic insulating material. The inorganic insulating material may include any of silicon oxide, silicon oxynitride, silicon nitride, and the like. In an embodiment, the organic insulating material may include any of an acrylic organic material and an imide-based organic material.

The optical functional layer OU may be on the input sensing layer TU. The optical functional layer OU may include the first layer 510 that covers the second conductive layer MTL2 and is arranged on the second insulating layer 420, and the second layer 520 arranged on the first layer 510.

An opening pattern 510OP may be formed in the first layer 510 to correspond to the emission area EA. According to an embodiment, a width of the opening pattern 510OP may be greater than that of the emission area EA in the same direction. The opening pattern 510OP is located in the light extraction direction of each pixel to thereby reinforce the straightness of light emitted by the emission area EA, and, thus, light extraction efficiency may be improved.

To further improve the above-described light extraction efficiency, the second layer 520 having a higher refractive index than the refractive index of the first layer 510 may be further arranged on the first layer 510. The first layer 510 may include an insulating material having a first refractive index, and the second layer 520 may include an insulating material having a second refractive index.

In an embodiment, the first refractive index of the first layer 510 may be in a range of about 1.3 to about 1.6. According to an embodiment, the first refractive index of the first layer 510 may be in a range of about 1.4 to about 1.55. The first layer 510 may include, for example, (ethyl)hexyl acrylate, pentafluoropropyl acrylate, poly(ethylene glycol) dimethacrylate, ethylene glycol dimethacrylate, or the like. According to an embodiment, the first layer 510 may include an acrylic organic material having a refractive index of about 1.5. In another embodiment, the first layer 510 may include a material included in the organic encapsulation layer 320 of the thin-film encapsulation layer TFE. According to an embodiment, the first layer 510 may include an epoxy-based organic material, and, in some cases, may include a photo-curable material.

The second layer 520 may be a planarization layer having a second refractive index. In an embodiment, the second refractive index of the second layer 520 may be in a range of about 1.65 to about 1.85. The second layer 520 may include, for example, polydiarylsiloxane, methyltrimethoxysilane, tetramethoxysilane, or the like. According to an embodiment, the second layer 520 may include an acrylic and/or siloxane-based organic material having a refractive index of about 1.6. According to another embodiment, the second layer 520 may include dispersed particles to have a high refractive index. Metal oxide particles, for example, zinc oxide (ZnOx), titanium oxide ($TiO_2$), zirconium oxide ($ZrO_2$), or barium titanate ($BaTiO_3$), may be dispersed in the second layer 520.

In an embodiment, the first layer 510 and the second layer 520 may be arranged in the display area DA, and may entirely cover the display area DA and each extend to the peripheral area NDA. The second layer 520 may be included to cover an end of the first layer 510 at a boundary between the display area DA and the peripheral area NDA. As the second layer 520 extends to the peripheral area NDA, an upper surface 520us of the second layer 520 covering an end of the first layer 510 may be included to be generally flat at the boundary between the display area DA and the peripheral area NDA.

According to a comparative example, when the second layer 520 does not sufficiently extend to the peripheral area NDA, a stain on a display panel may be visually recognized due to external light reflection according to a thickness deviation of the second layer 520 at an edge of the display area DA. Thus, in the display apparatus 1 according to an embodiment of the present disclosure, the second layer 520 sufficiently extends to the peripheral area NDA around the display area DA, and, accordingly, the upper surface 520us of the second layer 520 is included to be generally flat at the boundary between the display area DA and the peripheral area NDA, leading to a minimization or reduction of the thickness deviation of the second layer 520. Accordingly, visual recognition of a stain at the boundary between the display area DA and the peripheral area NDA may be effectively prevented.

Referring to the peripheral area NDA, a first partition wall PW1 and a second partition wall PW2 may be arranged in a portion of the peripheral area NDA that is adjacent to the display area DA. In an embodiment, the first partition wall PW1 and the second partition wall PW2 may be arranged to surround the display area DA. The first partition wall PW1 and the second partition wall PW2 may be arranged apart from each other. Valleys may be included between the first partition wall PW1 and the display area DA and between the first partition wall PW1 and the second partition wall PW2, respectively. The first partition wall PW1, the second partition wall PW2, and the valleys may prevent or substantially prevent overflow of the organic encapsulation layer 320 of the thin-film encapsulation layer TFE toward an edge of the substrate 100. In an embodiment, the organic encapsulation layer 320 may contact an inner surface of the first partition wall PW1 that faces the display area DA. In this case, the organic encapsulation layer 320 contacting the inner surface of the first partition wall PW1 may be understood as the first inorganic encapsulation layer 310 being between the organic encapsulation layer 320 and the first partition wall PW1 and the organic encapsulation layer 320 being in direct contact with the first inorganic encapsulation layer 310. The first inorganic encapsulation layer 310 and the second inorganic encapsulation layer 330 may be on the first and second partition walls PW1 and PW2 and may extend toward the edge of the substrate 100.

In an embodiment, as shown in FIG. 6, the display apparatus 1 includes the first partition wall PW1 and the second partition wall PW2. However, according to another embodiment, a display apparatus may include only the first partition wall PW1, or may further include a partition wall adjacent to the second partition wall PW2. In an embodiment, the first partition wall PW1 may include a portion 118P1 of the second planarization insulating layer 118, a portion 119P1 of the pixel defining layer 119, and a portion 121P1 of the spacer 121, and the second partition wall PW2 may include a portion 117P2 of the first planarization insulating layer 117, a portion 118P2 of the second planarization insulating layer 118, and a portion 119P2 of the pixel defining layer 119. According to another embodiment, the first partition wall PW1 and the second partition wall PW2 may further include respective portions of other layers, or portions of the aforementioned layers may be omitted.

The common power supply line 70 may be located outside the driving voltage supply line 60. The common power supply line 70 may extend below first partition wall PW1 and a portion of the second partition wall PW2. The common power supply line 70 may be electrically connected to the opposite electrode 230 of the organic light-emitting diode OLED via a connecting electrode 72. According to an embodiment, the common power supply line 70 may be arranged on a same layer as the layer on which the driving voltage supply line 60 is arranged, and may include a same material as the material included in the source electrode S of the thin-film transistor TFT, and the connecting electrode 72 may include a same material as the material included in the pixel electrode 210 of the organic light-emitting diode OLED.

The second layer 520 of the optical functional layer OU may extend to the peripheral area NDA and may overlap the first partition wall PW1 and the second partition wall PW2.

As described above with reference to FIG. 5, the peripheral area NDA may include the bending area BA in at least a portion thereof. The bending area BA may be arranged apart from the first partition wall PW1 and the second partition wall PW2. According to an embodiment, the inorganic insulating layer IOL may include an opening IOL-OP in correspondence to the bending area BA. In other words, the inorganic insulating layer IOL arranged in correspondence to the bending area BA may be removed from the bending area BA. In an embodiment, as shown in FIG. 6, the inorganic insulating layer IOL corresponding to the bending area BA is entirely removed. However, according to another embodiment, the buffer layer 111 may remain without being partially or entirely removed. Such a removal of a portion or the entirety of the inorganic insulating layer IOL located on the bending area BA may prevent or substantially prevent propagation of cracks by the inorganic insulating layer IOL while the substrate 100 is being bent.

In an embodiment, a third partition wall PW3 may be located on the bending area BA. As described above, because cracks may be generated in an inorganic layer when the inorganic layer is located on the bending area BA, the third partition wall PW3 may generally include an organic insulating material. According to an embodiment, the third partition wall PW3 may include a portion 117P3 of the first planarization insulating layer 117, a portion 118P3 of the second planarization insulating layer 118, a portion 119P3 of the pixel defining layer 119, and a portion 121P3 of the spacer 121.

A connection wire CW may be arranged on the bending area BA. The connection wire CW may be a portion of each of the fanout wires FW of FIG. 5. The fanout wires FW may transmit a data signal to each pixel through the connection wire CW located on the bending area BA. According to an embodiment, the connection wire CW may be between a first organic layer, which is the portion 117P3 of the first planarization insulating layer 117, and a second organic layer, which is the portion 118P3 of the second planarization insulating layer 118. In this case, the connection wire CW may include a same material as that included in the contact metal 120. According to another embodiment, the connection wire CW may include a same material as that included in the source electrode S of the thin-film transistor TFT. In an embodiment, a metal layer that forms the connection wire CW may have a higher tensile force than the fanout wires FW arranged in the peripheral area NDA with the exception of the bending area BA. According to an embodiment, the fanout wires FW arranged in the peripheral area NDA with the exception of the bending area BA may include a same material as that included in the gate electrode G of the thin-film transistor TFT or the second capacitor plate CE2 of the storage capacitor Cst.

The first inorganic encapsulation layer 310 and the second inorganic encapsulation layer 330 of the thin-film encapsulation layer TFE may each extend to the third partition wall PW3. According to an embodiment, respective ends of the first inorganic encapsulation layer 310 and the second inorganic encapsulation layer 330 may be arranged over the third partition wall PW3 or may be located on the third partition wall PW3.

The second layer 520 of the optical functional layer OU may be located on the third partition wall PW3. In an embodiment, a stress reduction layer 700 may be on the second layer 520 on the third partition wall PW3. The stress reduction layer 700 may be arranged to correspond to the bending area BA, and may include an organic insulating material. The stress reduction layer 700 may move a neutral plane of the bending area BA upwards, and may compensate for a modulus of the layers arranged in correspondence with the bending area BA to reduce stress applied to the bending area BA.

An upper surface 520us' of the second layer 520 arranged on the stress reduction layer 600 may be slanted. In an embodiment, the second layer 520 is formed of an organic insulating material and a thickness of an end thereof gradually decreases, and the upper surface 520us' of the second layer 520 corresponding to the bending area BA is a portion of the display panel DP that is not visually recognized by a user, and, thus, no stains are visually recognized even when the upper surface 520us' of the second layer 520 is formed to be slanted.

The pad portion PD may be located on an edge of the peripheral area NDA. The pad portion PD may include the first pads 40-P and the second pads 50-P for contacting the terminal portion 40 and the data driving unit 50 respectively of FIG. 5. The first pads 40-P and the second pads may be dual layers including first conductive layers 120P1 and 120P2 and second conductive layers 210P1 and 210P2. For example, the first conductive layers 120P1 and 120P2 may include a same material as that included in the contact metal 120, and the second conductive layers 210P1 and 210P2 may include a same material as that included in the pixel electrode 210. However, embodiments of the disclosure are not limited thereto. According to some embodiments, edges of the first conductive layer 120P1 and the second conductive layer 210P1 of the first pad 40-P corresponding to the terminal portion 40 of FIG. 5 may be covered by first and second insulating layers IL1 and IL2. Although, in an embodiment, the second pad 50-P is entirely exposed on the inorganic insulating layer IOL, as shown in FIG. 6, the above-described structure of the first and second insulating layers IL1 and IL2 is equally applicable to the second pad 50-P.

A control dam CD may be arranged on a region of the peripheral area NDA that is outside the third partition wall PW3. The second layer 520 may be controlled by the control dam CD. The control dam CD may be located between the bending area BA and the pad portion PD such that the second layer 520 does not extend to the pad portion PD. Because the pad portion PD is connected to an IC and/or a printed circuit board, the second layer 520 may be arranged to not overlap the pad portion PD.

According to an embodiment, the control dam CD may be arranged on the inorganic insulating layer IOL, and may include a same material as that included in the first layer 510 of the optical functional layer OU. As described above, the second layer 520 is controlled by the control dam CD, and, thus, the second layer 520 may not extend over the control dam CD.

In an embodiment, the control dam CD may include a first dam CD1 and a second dam CD2 spaced apart from each other. A width W1 of the first dam CD1 and a width W2 of the second dam CD2 may be the same as each other or different from each other. According to an embodiment, the width W1 of the first dam CD1 may be equal to or greater than the width W2 of the second dam CD2. Structures of the control dam CD and the second layer 520 will now be described with reference to FIGS. 7A through 7D.

FIGS. 7A through 7D are schematic enlarged cross-sectional views of a portion of a display panel of a display apparatus according to some embodiments. FIGS. 7A through 7D illustrate enlarged views of a region "C" of FIG. 6 where the control dam CD is located.

Figure 7A:
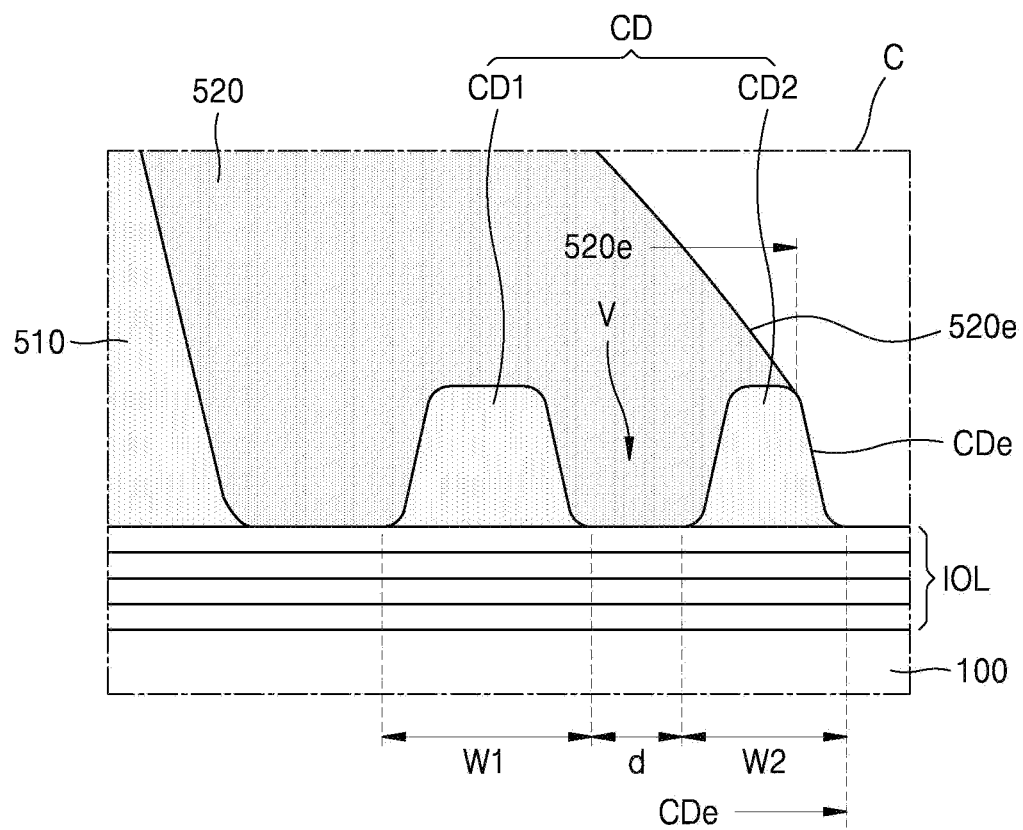
FIGS. 7A through 7D are schematic enlarged cross-sectional views of a region "C" of FIG. 6, according to some embodiments.

Referring to FIG. 7A, the control dam CD may include the first dam CD1 and the second dam CD2 spaced apart from each other, and a valley V may be included between the first dam CD1 and the second dam CD2. As described above, the second layer 520 may be controlled by the first dam CD1, the second dam CD2, and the valley V included therebetween.

According to an embodiment, the width W1 of the first dam CD1 may be greater than the width W2 of the second dam CD2. In an embodiment, a distance d between the first and second dams CD1 and CD2 may be equal to or less than the width W1 of the first dam CD1 or the width W2 of the second dam CD2. For example, the distance d between the first and second dams CD1 and CD2 may less than the width W1 of the first dam CD1 and may be equal to the width W2 of the second dam CD2.

As shown in FIGS. 7A through 7D, an end 520e of the second layer 520 may be arranged so as not to extend beyond an end CDe of the control dam CD arranged on the side of the pad portion PD, namely, the second dam CD2. The second layer 520 may be included so as not to extend beyond the control dam CD, due to a surface tension of the control dam CD and the valley V between the first dam CD1 and the second dam CD2.

Figure 7B:
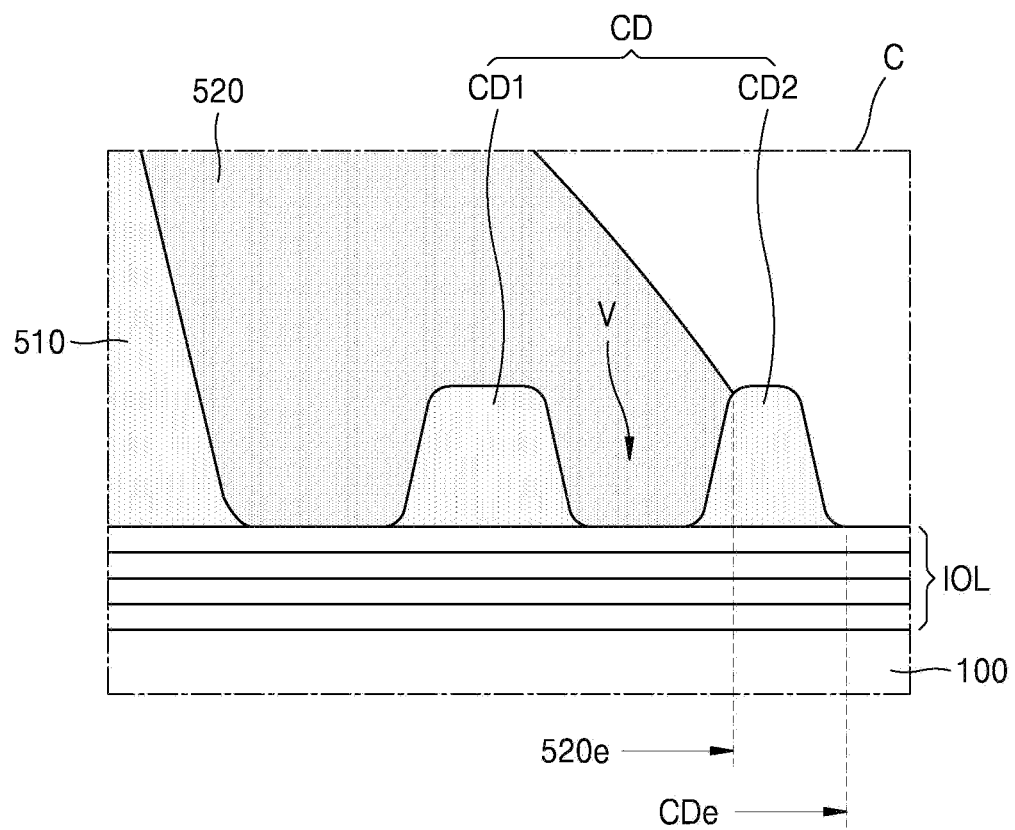
Figure 7C:
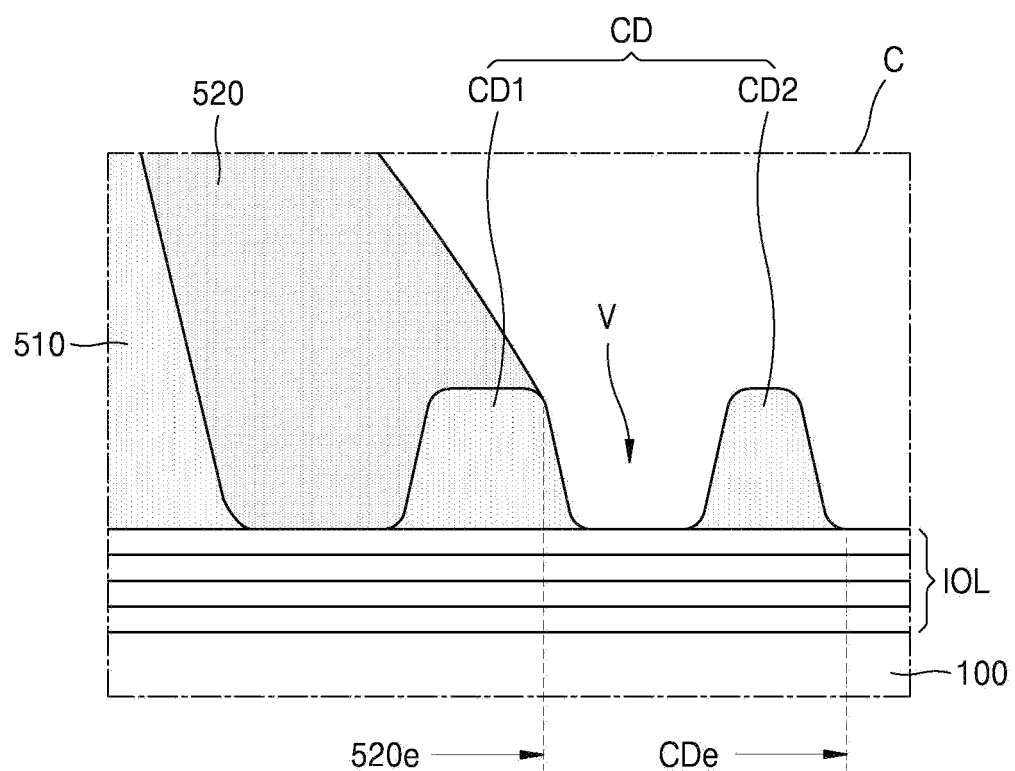
Figure 7D:
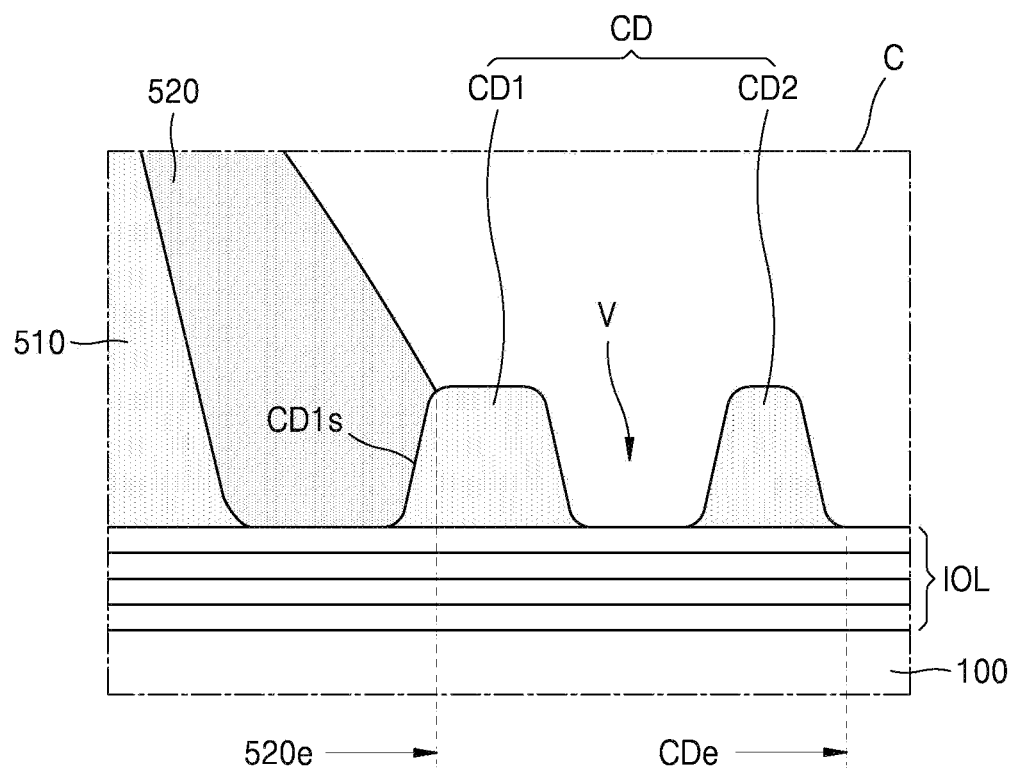

For example, as shown in FIG. 7A, the second layer 520 may be arranged to overlap the control dam CD and cover the first dam CD1 and the second dam CD2. According to another embodiment, as shown in FIG. 7B, the second layer 520 may be controlled by the valley V and thus may cover the first dam CD1 but may not cover the second dam CD2. According to another embodiment, as shown in FIG. 7C, the second layer 520 may be controlled by the first dam CD1 and thus may cover an upper surface of the first dam CD1 but may not overlap the valley V. According to another embodiment, as shown in FIG. 7D, the second layer 520 may be controlled by the first dam CD1 and thus may contact only an inner surface CD1s of the first dam CD1.

Figure 8:
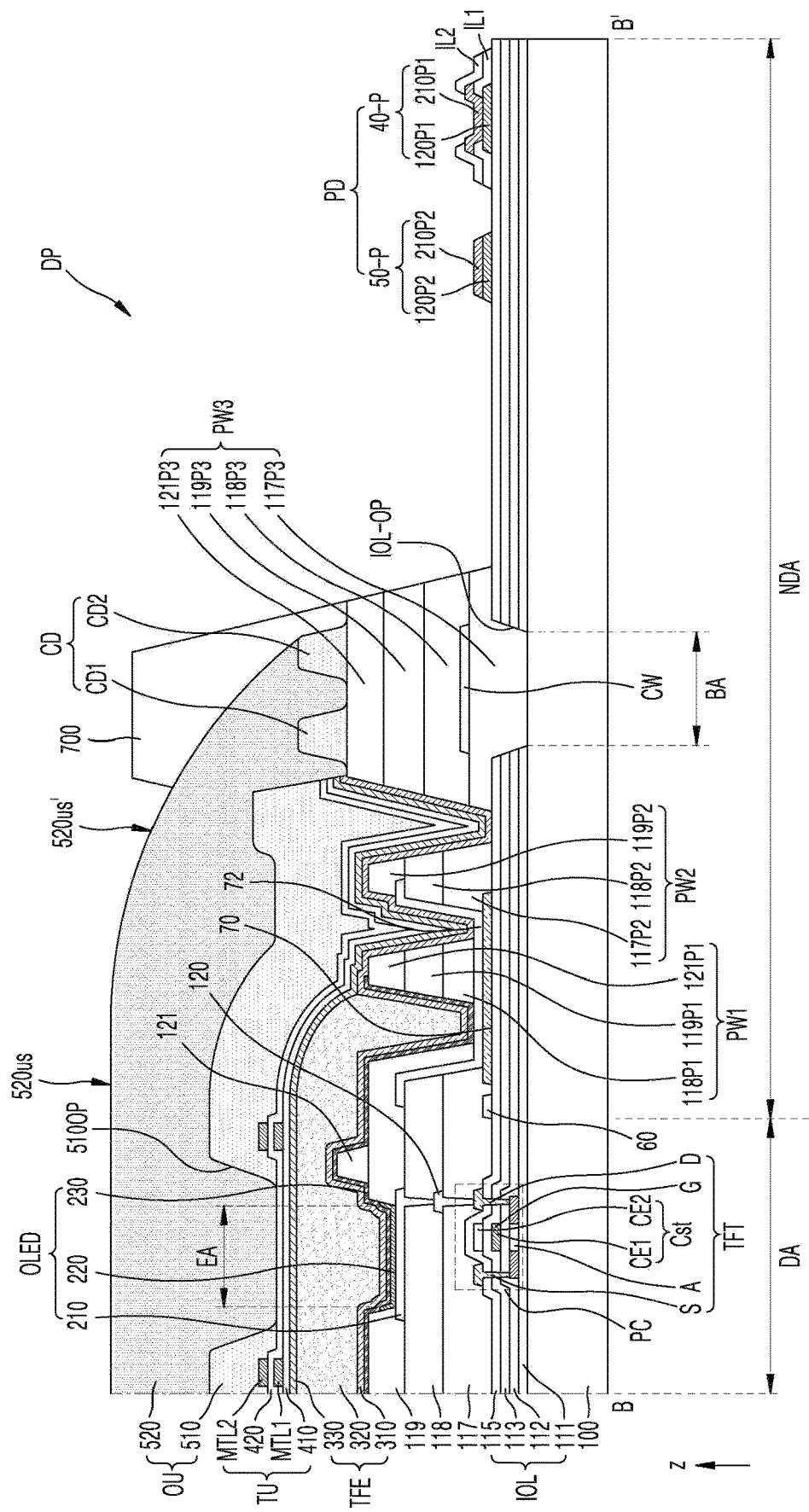
FIG. 8 is a schematic cross-sectional view of a portion of a display panel of a display apparatus according to an embodiment.

FIG. 8 is a schematic cross-sectional view of a portion of a display panel of a display apparatus according to an embodiment.

FIG. 8 is similar to FIG. 6, but is different from FIG. 6 in terms of a location of the control dam CD. The other components may be the same as those of the display apparatus of FIG. 6, and, thus, differences between FIGS. 6 and 8 are mainly described.

Referring to FIG. 8, the control dam CD may be arranged in the bending area BA. The control dam CD may be located on the third partition wall PW3 located in the bending area BA. In an embodiment, as shown in FIG. 8, the control dam CD may be arranged directly on the third partition wall PW3. According to another embodiment, the first and second inorganic encapsulation layers 310 and 330 and the first and second inorganic insulating layers 410 and 420 may each extend on the third partition wall PW3, and at least a portion of the control dam CD may be arranged on the second inorganic insulating layer 420 extending over the third partition wall PW3.

The second layer 520 controlled by the control dam CD may extend to the bending area BA where the control dam CD is located. When an end of the second layer 520 is arranged to coincide with an end of the control dam CD, namely, an end of the second dam CD2, the second layer 520 may overlap at least a portion of the bending area BA. The stress reduction layer 700 may be on the second layer 520 in correspondence with the bending area BA.

Figure 9:
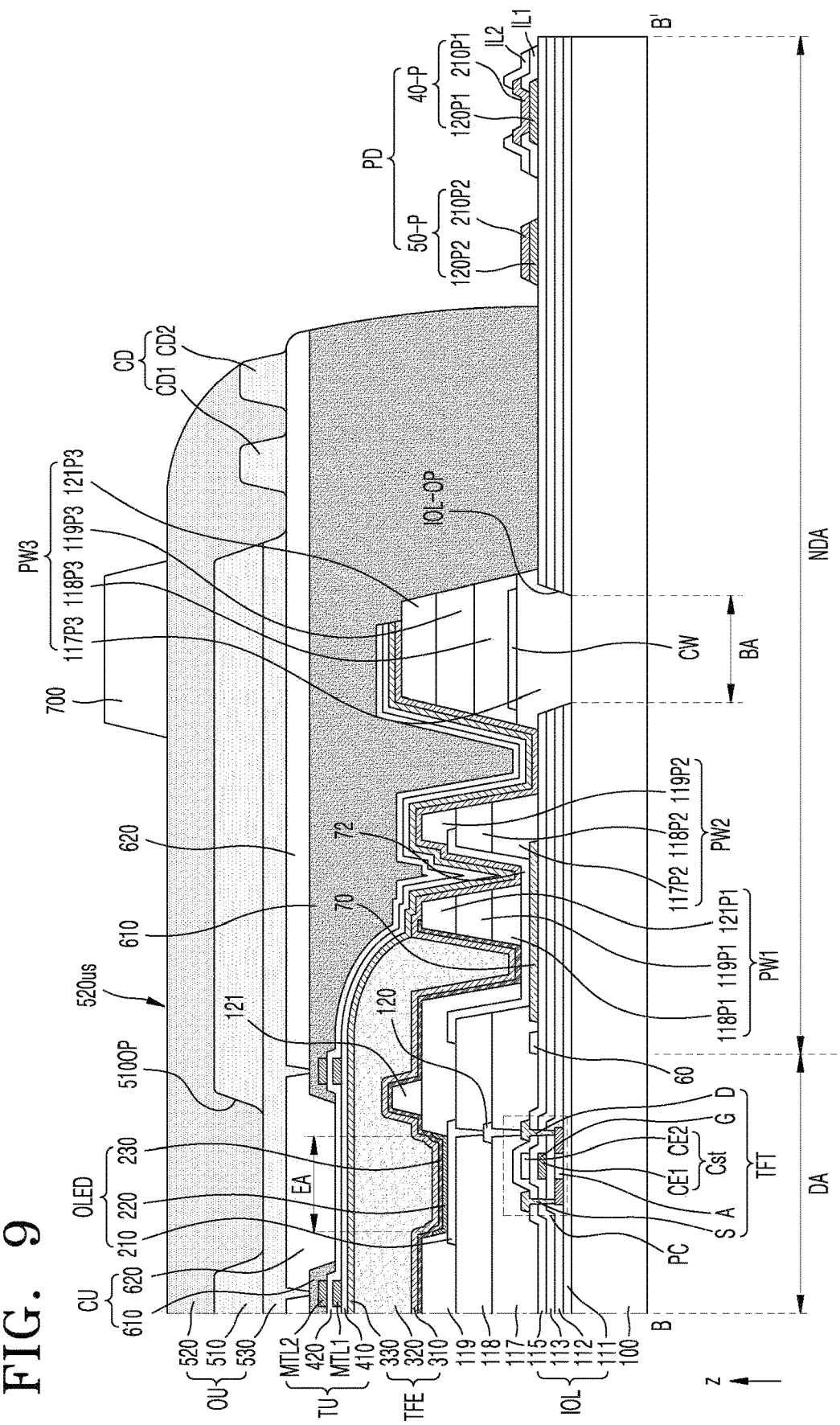
FIGS. 9 through 11 are schematic cross-sectional views of portions of a display panel of a display apparatus according to some embodiments.
Figure 10:
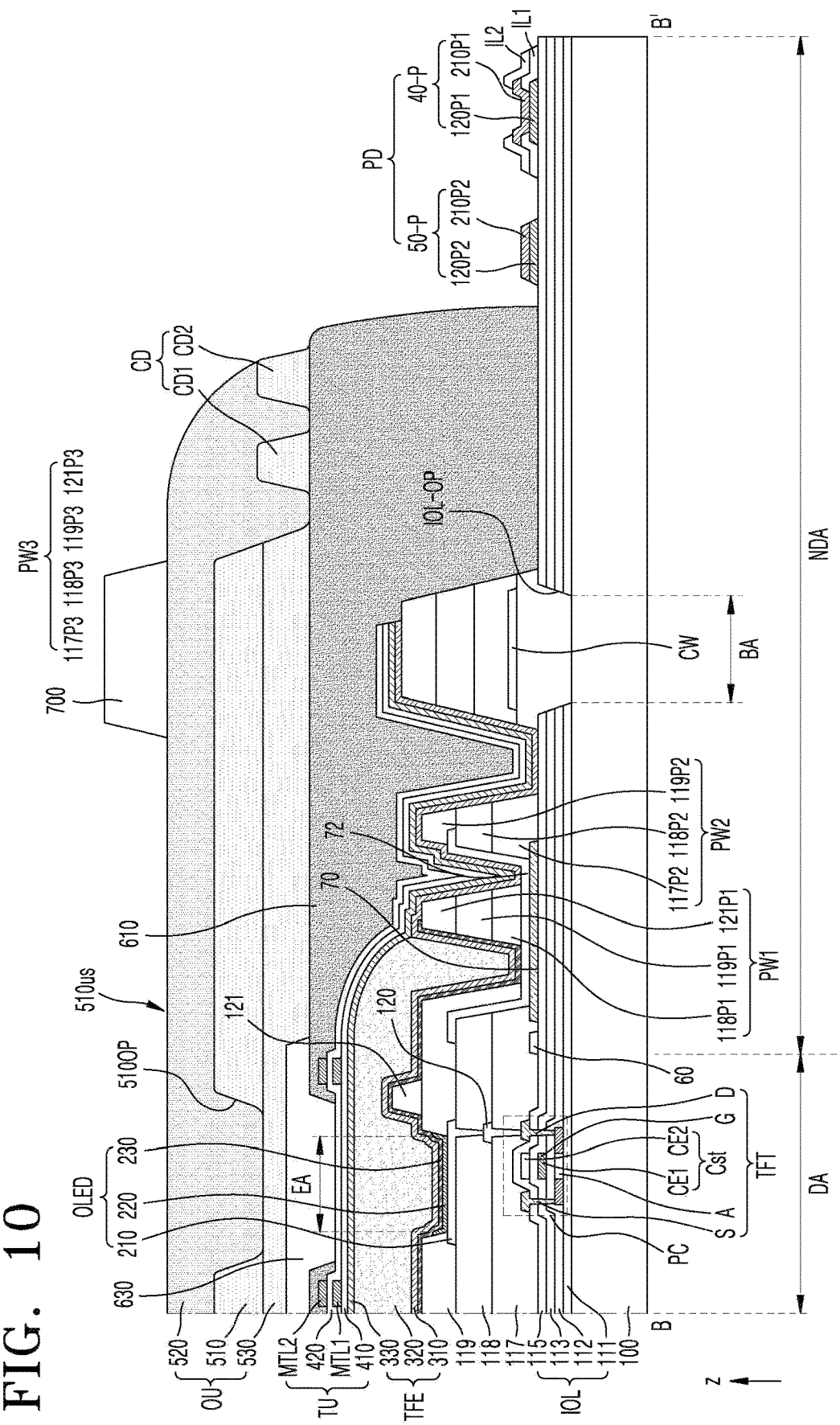
Figure 11:
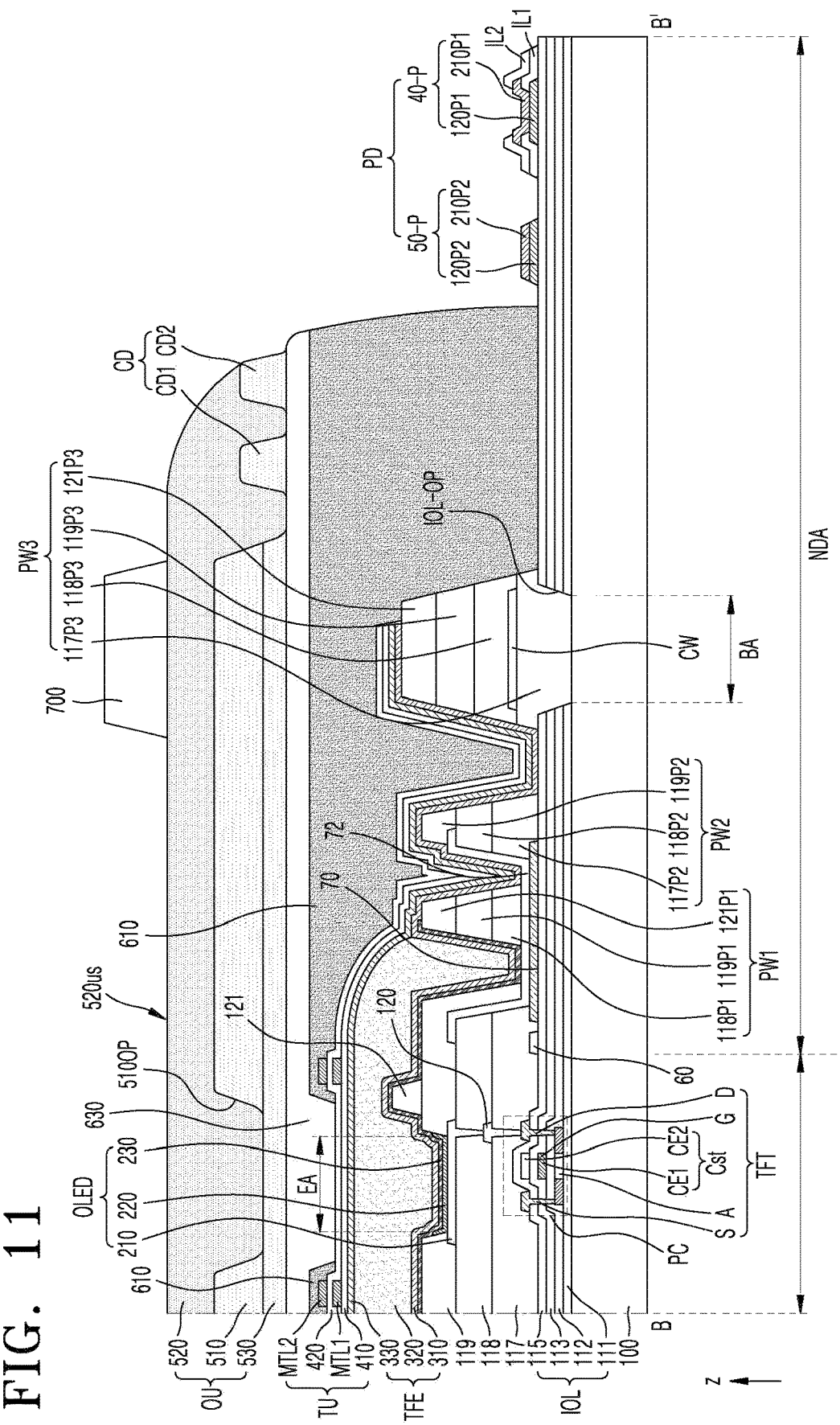

FIGS. 9 through 11 are schematic cross-sectional views of a portion of a display panel of a display apparatus according to some embodiments.

FIGS. 9 through 11 illustrate modifications of FIG. 6. Display panels DP of FIGS. 9 through 11 are different from the display panel DP of FIG. 6 in terms of a structure over the thin-film encapsulation layer TFE. Thus, the differences in terms of the structure over the thin-film encapsulation layer TFE are mainly described, and repeated descriptions may refer to the above-described FIG. 6.

Referring to FIG. 9, the anti-reflection layer CU may be formed on the input sensing layer TU in correspondence with the display area DA. The anti-reflection layer CU may include a black matrix 610 and a color filter 620. The color filter 620 may be arranged on the emission area EA of the organic light-emitting diode OLED. The color filter 620 may have a red, green, or blue pigment or dye according to the color of light emitted by the organic light-emitting diode OLED.

The optical functional layer OU may be on the anti-reflection layer CU. The optical functional layer OU may include a first layer 510, a second layer 520, and a third layer 530 arranged on the color filter 620.

The third layer 530 may be arranged to cover the color filter 620, and may be between the first layer 510 and the color filter 620 to planarize an upper surface on which the first layer 510 is to be arranged. According to an embodiment, the third layer 530 may include a same material as that included in the first layer 510.

An opening pattern 510OP may be formed in the first layer 510 to correspond to the emission area EA. The opening pattern 510OP is located in the light extraction direction of each pixel to thereby reinforce the straightness of light emitted by the emission area EA, and, thus, light extraction efficiency may be improved.

To further improve the above-described light extraction efficiency, the second layer 520 having a higher refractive index than the refractive index of the first layer 510 may be further arranged on the first layer 510. The first layer 510 may include an insulating material having a first refractive index, and the second layer 520 may include an insulating material having a second refractive index. The material constituting the first layer 510 and the second layer 520 and a physical property including a refractive index may be the same as those in FIG. 6.

The black matrix 610 may extend to the peripheral area NDA. The black matrix 610 may overlap the bending area BA. In this case, the black matrix 610 may cover the third partition wall PW3 on the bending area BA but may not overlap the pad portion PD.

The black matrix 610 may be arranged in correspondence with the peripheral area NDA, and an upper surface of the black matrix 610 may be approximately flat. As described above, the first through third partition walls PW1, PW2, and PW3 and valleys therebetween may be arranged in the peripheral area NDA. The black matrix 610 may extend to the peripheral area NDA and cover the first through third partition walls PW1, PW2, and PW3 and the valleys therebetween, thereby planarizing a lower structure on which the second layer 520 is arranged and also preventing or substantially preventing external light reflection due to structures on the peripheral area NDA.

The color filter 620 may extend to the peripheral area NDA. The color filter 620 extending to the peripheral area NDA does not perform an optical function in contrast with the color filter 620 located in the display area DA, but may be arranged on the black matrix 610 extending to the peripheral area NDA and thus may further planarize the lower surface on which the second layer 520 is arranged. Although the color filter 620 is included as the same layer on the peripheral area NDA in FIG. 9, layers including a red, green, or blue pigment or dye may be patterned and arranged as in the display area DA.

The second layer 520 may cover the first layer 510 arranged in the display area DA, and may extend to the peripheral area NDA. The stress reduction layer 700 may be further arranged on the second layer 520 in correspondence with the bending area BA. The stress reduction layer 700 may prevent or substantially prevent application of an excessive tensile force or the like to the connection wire CW arranged on the substrate 100 within the bending area BA as the substrate 100 or the like is bent. When the stress reduction layer 700 is not included, a location of a wire in the bending area BA may not correspond to a stress neutral plane, and, thus, stress may be concentrated on the bending area BA. Accordingly, the inclusion of the stress reduction layer 700 adjusts a thickness, a modulus, and the like of the layers arranged on the bending area BA, and, thus, a location of a stress neutral plane within a stack including all of the substrate 100, the connection wire CW, and the stress reduction layer 700 in the bending area BA may be controlled. Because the stress neutral plane is positioned near the connection wire CW in the bending area BA due to the stress reduction layer 700, stress applied to the connection wire CW in the bending area BA may be effectively reduced.

According to an embodiment, the stress reduction layer 700 may include an organic insulating material, and may include, for example, an organic material, such as such as polyimide, epoxy resin, acrylic resin, polyester, photoresist, polyacrylic resin, polyimide-based resin, polyamide-based resin, or siloic acid resin, and an elastic material including silicon, urethane, thermoplastic polyurethane, and the like. A width of the stress reduction layer 700 may be equal to or greater than a width of the bending area BA. For example, the width of the stress reduction layer 700 may be 40 mm to 60 mm. In an embodiment, a thickness of the stress reduction layer 700 may be about 100 μm to about 140 μm, but may vary according to the location of the stress neutral plane of the stack on the bending area BA.

The second layer 520 may be controlled by the control dam CD arranged on the color filter 620. The control dam CD may be arranged on an edge of the color filter 620 arranged on the black matrix 610 extending to the peripheral area NDA. Because the second layer 520 is controlled by the control dam CD, the second layer 520 may not extend beyond the control dam CD. Because the second layer 520 extending to the peripheral area NDA is arranged on the black matrix 610 and the color filter 620 of which respective upper surfaces have been previously planarized, the second layer 520 may have a generally flat upper surface on the display area DA and the peripheral area NDA. As such, the upper surface 520*us* of the second layer 520 is included to be generally flat at the boundary between the display area DA and the peripheral area NDA, leading to minimization or reduction of a thickness deviation of the second layer 520. Accordingly, visual recognition of a stain at the boundary between the display area DA and the peripheral area NDA may be effectively prevented.

Referring to FIGS. 10 and 11, a wavelength adjustment layer 630 may be arranged on the input sensing layer TU of the display area DA. In an embodiment, the wavelength adjustment layer 630 is similar to the color filter 620 of FIG. 9, but is different therefrom in that the wavelength adjustment layer 630 is not patterned for each pixel but is integrally formed over the entire surface of the display area DA. The wavelength adjustment layer 630 may selectively absorb light of a specific wavelength, and, thus, color reproducibility of the organic light-emitting diode OLED may be increased and external light reflection may be prevented or substantially prevented. In an embodiment, because the wavelength adjustment layer 630 is not patterned for each pixel but is integrally formed over the entire surface of the display area DA, the wavelength adjustment layer 630 may contribute to reducing the number of masks in a manufacturing process compared with the color filter 620 of FIG. 9.

The wavelength adjustment layer 630 may include an organic insulating material, and may include a pigment or a dye. For example, the wavelength adjustment layer 630 may include any of an oxazine-based compound, a cyanine-based compound, a tetrazoporphine-based compound, and a squarylium-based compound. According to another embodiment, the wavelength adjustment layer 630 may have a multi-layered structure including two or more layers. In this case, a first layer may include a dye, a pigment, or a combination thereof, and a second layer on the first layer may include carbon black, a black pigment, an RGB pigment, or any combination thereof.

The wavelength adjustment layer 630 may be arranged to correspond to only the display area DA as shown in FIG. 10, or may be arranged to extend to the peripheral area NDA as shown in FIG. 11. Referring to FIG. 10, the wavelength adjustment layer 630 may be arranged to correspond to the display area DA, and the third layer 530 may be arranged to cover the wavelength adjustment layer 630. Accordingly, the second layer 520 may be arranged directly on the black matrix 610 extending in correspondence with the peripheral area NDA. Similar to the above description, the second layer 520 may be controlled by the control dam CD arranged on an edge of the black matrix 610.

Referring to FIG. 11, the wavelength adjustment layer 630 may extend to the peripheral area NDA. Accordingly, the wavelength adjustment layer 630 may be arranged on the black matrix 610 extending to the peripheral area NDA, and the second layer 520 may be arranged on the wavelength adjustment layer 630. The second layer 520 may be controlled by the control dam CD arranged on an edge of the wavelength adjustment layer 630. In an embodiment, when the wavelength adjustment layer 630 extends to the peripheral area NDA, the wavelength adjustment layer 630 may be integrally formed in correspondence with the display area DA and the peripheral area NDA.

Figure 12:
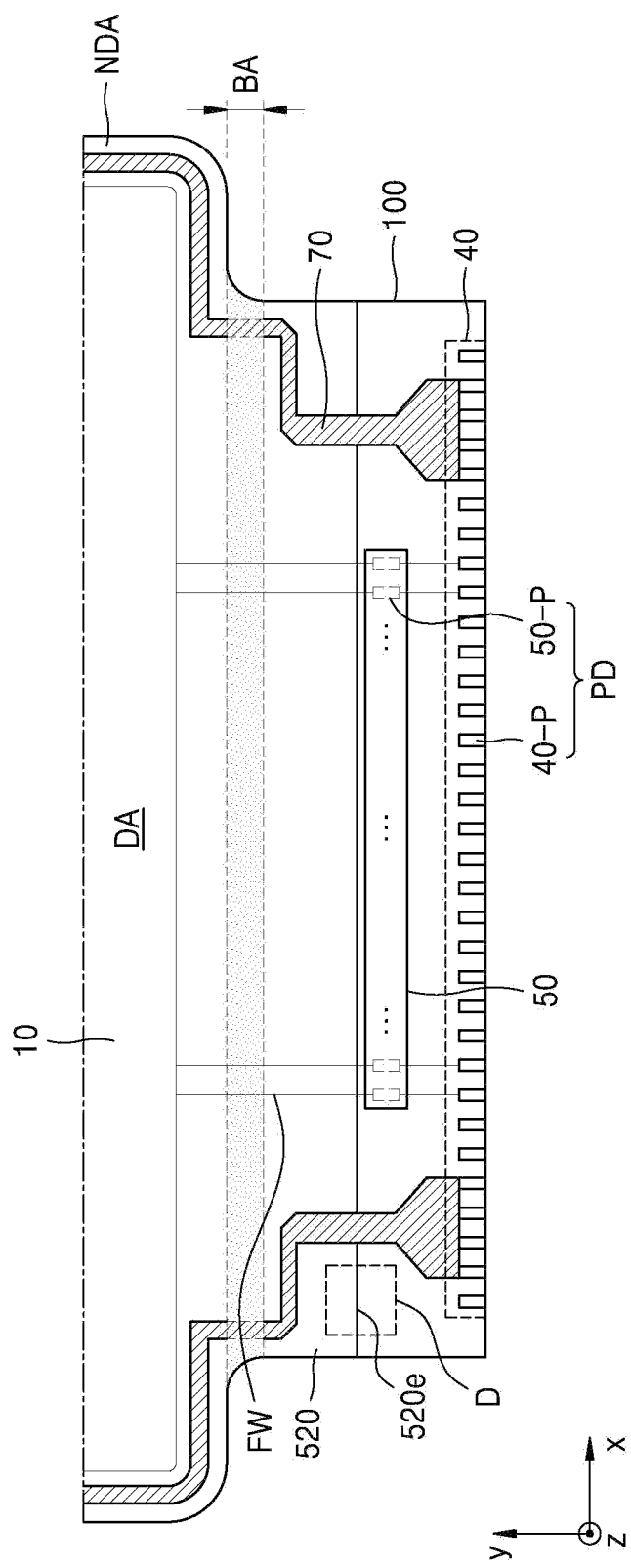
FIG. 12 is a schematic plan view of a portion of a display apparatus according to an embodiment.
Figure 13:
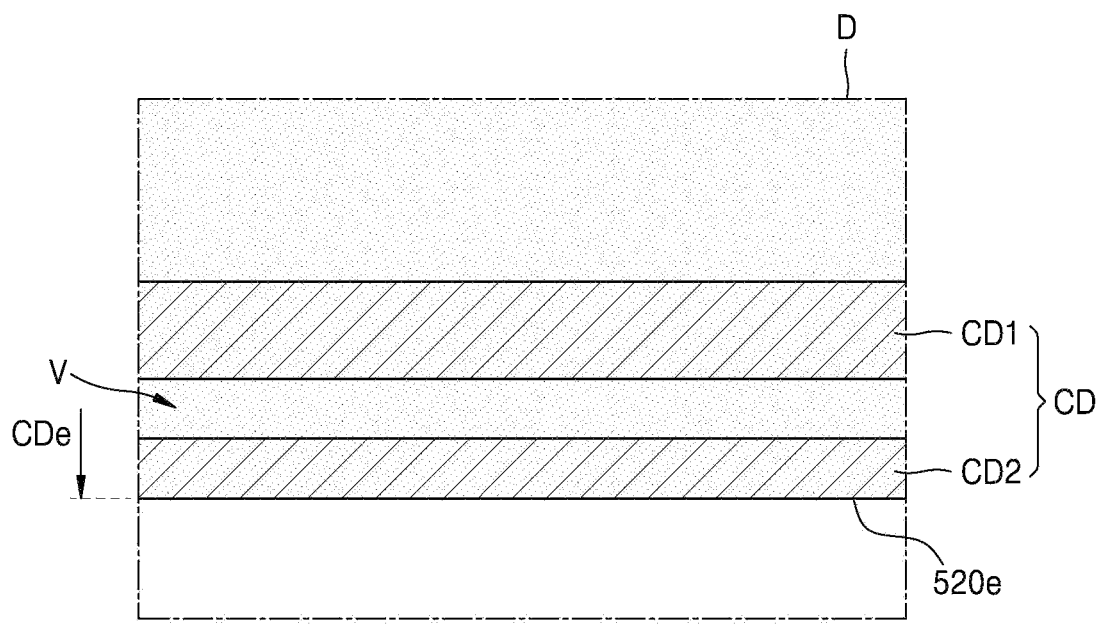
FIG. 13 is a schematic enlarged plan view of a region "D" of FIG. 12, according to an embodiment.

FIG. 12 is a schematic plan view of a portion of a display apparatus according to an embodiment of the disclosure; and FIG. 13 is a schematic enlarged plan view of a region "D" of FIG. 12.

FIG. 12 is substantially the same as the description given above with reference to FIG. 5. Referring to FIG. 12, the substrate 100 may include the display area DA, and the peripheral area NDA surrounding the display area DA. A portion of the peripheral area NDA may extend to a side (e.g., a −y direction), and the terminal portion 40, the data driving unit 50, the common voltage supply line 70, and the fanout wires FW may be arranged on the extending peripheral area NDA. In FIG. 12, illustration of the driving voltage supply line 60 is omitted.

The substrate 100 may include a bending area BA in correspondence with a portion of the peripheral area NDA. For example, the bending area BA may be a portion of the extending peripheral area NDA. The bending area BA is bendable such that the extending peripheral area NDA overlaps a portion of the display area DA, and, thus, a width of the peripheral area NDA that is visually recognized by a user may be reduced.

The display unit 10 may be located on the display area DA. The peripheral area NDA may extend to a side of the display unit 10, and the bending area BA may be included.

A pad portion PD may be located on a side of the display area DA. The pad portion PD may be located on the peripheral area NDA of the substrate 100. The pad portion PD may include the first pads 40-P and the second pads 50-P for contacting the terminal portion 40 and data driving unit 50, respectively.

The second layer 520 may be on the display area DA. As described above with reference to FIG. 6, the second layer 520 may constitute the optical functional layer OU together with the first layer 510 below the second layer 520. In an embodiment, the second layer 520 may be formed over the entire surface of the display area DA and may partially extend to the peripheral area NDA.

The second layer 520 may extend over the peripheral area NDA while covering the bending area BA, and may not overlap the data driving unit 50. An end 520e of the second layer 520 may be located between the bending area BA and the data driving unit 50. In an embodiment, as shown in FIG. 12, the second layer 520 may be arranged over the entire surface of the substrate 100 with the exception of the terminal portion 40 and the data driving unit 50. The second layer 520 may be arranged to an edge of the substrate 100 in a remaining portion of the peripheral area NDA excluding the end 520e located between the bending area BA and the data driving unit 50.

Referring to FIG. 13, the second layer 520 may be controlled by the control dam CD. In other words, the second layer 520 may extend to the peripheral area NDA but may not extend over the control dam CD. The control dam CD may control the area of the second layer 520 through the first and second dams CD1 and CD2 spaced apart from each other and the valley V included therebetween. According to an embodiment, the end 520e of the second layer 520 and an end CDe of the control dam CD may coincide with each other.

Figure 14:
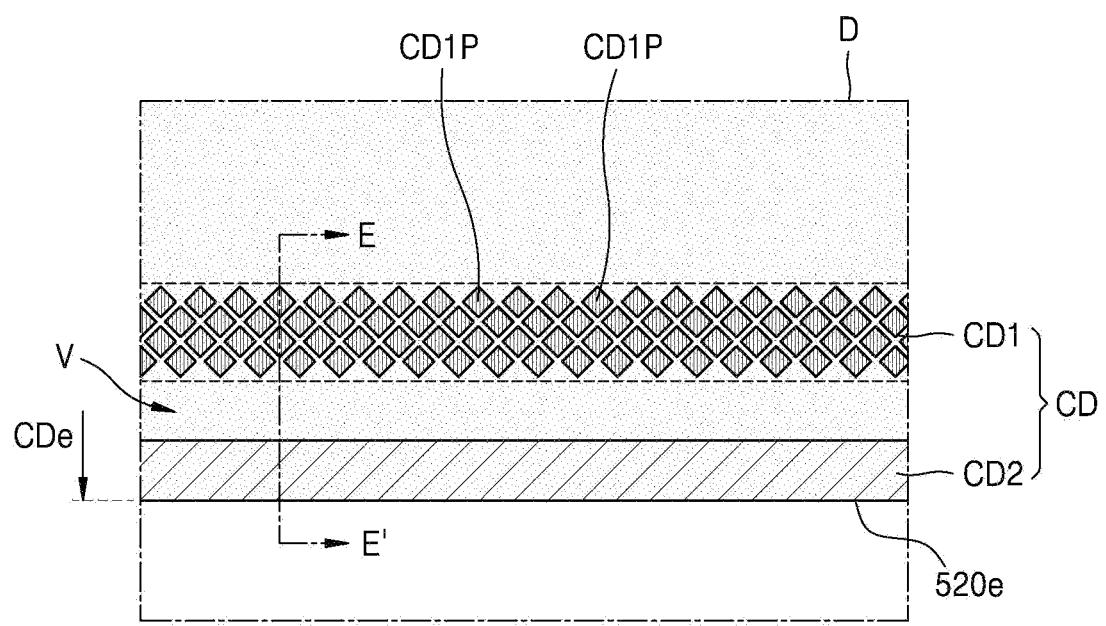
FIG. 14 is a schematic enlarged plan view of a region "D" of FIG. 12, according to an embodiment.
Figure 15:
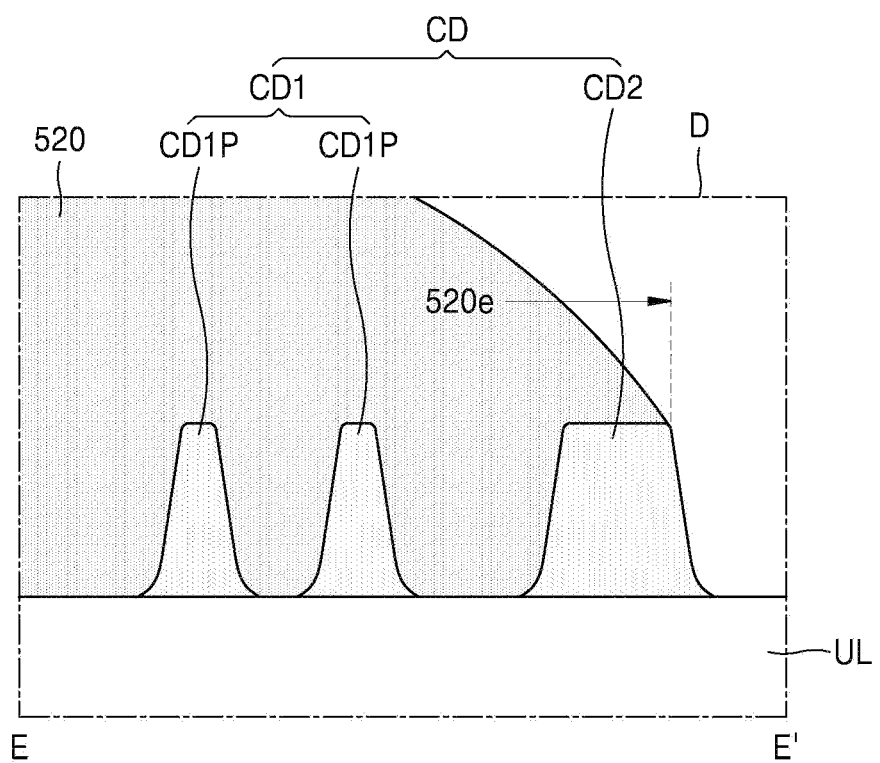
FIG. 15 is a schematic cross-sectional view, taken along the line E-E' of FIG. 14, according to an embodiment.

FIG. 14 is a schematic enlarged plan view of a region "D" of FIG. 12, according to an embodiment; and FIG. 15 is a schematic cross-sectional view taken along the line E-E' of FIG. 14.

Referring to FIGS. 14 and 15, the first dam CD1 of the control dam CD may include a plurality of patterns CD1P. FIG. 15 illustrates that the control dam CD is arranged on an underlayer UL. The underlayer UL may be the inorganic insulating layer IOL as shown in FIG. 6, or may be the black matrix 610, the color filter 620, or the wavelength adjustment layer 630 as shown in FIGS. 9 through 11. In other words, a structure of the plurality of patterns CD1P according to the present embodiment is equally applicable to all of the above-described embodiments. A structure like the plurality of patterns CD1P is also applicable to the second dam CD2.

The plurality of patterns CD1P may be arranged in rows and columns, and a plurality of patterns CD1P arranged in adjacent rows in a partial region may be arranged shifted by half of a distance between columns. According to an embodiment, each of the plurality of patterns CD1P may have a diamond shape. The diamond shape may refer to at least one vertex of each of the plurality of patterns CD1P facing the end 520e of the second layer 520. The plurality of patterns CD1P may be spaced apart from each other, and, thus, a fine valley may be included between the plurality of patterns CD1P.

As such, as the first dam CD1 is included to include the plurality of patterns CD1P, a surface area of the first dam CD1 capable of controlling the second layer 520 may be widened, and an area where the second layer 520 is formed may be easily controlled through the fine valley between the plurality of patterns CD1P.

According to one or more embodiments as described above, a display apparatus having an improved reliability by effectively controlling spreading of an organic layer may be realized. Of course, aspects and the scope of the present disclosure are not limited thereto.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
a substrate comprising a display area and a peripheral area adjacent to the display area, and comprising a bending area where at least a portion of the peripheral area is bent;
a display element on the display area;
a pad portion arranged on the peripheral area with the bending area between the display element and the pad portion;
an input sensing layer over the display element; and
an optical functional layer over the input sensing layer and comprising a first layer having an opening corresponding to the display element, and a second layer having a different refractive index from the first layer,
wherein the second layer is arranged to extend to the peripheral area and cover the bending area.

2. The display apparatus of claim 1, further comprising a control dam between the bending area and the pad portion.

3. The display apparatus of claim 2, wherein an end of the second layer does not extend beyond an end of the control dam that faces the pad portion.

4. The display apparatus of claim 2, wherein the control dam comprises a same material as a material included in the first layer.

5. The display apparatus of claim 2, wherein the control dam comprises a first dam and a second dam spaced apart from each other, and
a valley is located between the first dam and the second dam.

6. The display apparatus of claim 5, wherein a width of the first dam is greater than a width of the second dam.

7. The display apparatus of claim 5, wherein the first dam comprises a plurality of patterns.

8. The display apparatus of claim 1, further comprising a stress reduction layer arranged on the second layer corresponding to the bending area.

9. The display apparatus of claim 8, wherein the stress reduction layer comprises an organic insulating material.

10. The display apparatus of claim 1, wherein a refractive index of the second layer is greater than a refractive index of the first layer.

11. The display apparatus of claim 1, further comprising:
a thin-film encapsulation layer between the display element and the input sensing layer and comprising at least one inorganic encapsulation layer and at least one organic encapsulation layer; and
a partition wall between the display element and the bending area and configured to control the at least one organic encapsulation layer,
wherein the second layer overlaps the partition wall.

12. The display apparatus of claim 1, further comprising:
an inorganic insulating layer on the substrate and having an opening corresponding to the bending area;
a first organic layer arranged on the bending area to correspond to the opening of the inorganic insulating layer;
a connection wire on the first organic layer and configured to transmit a signal from the pad portion to the display element; and
a second organic layer covering the connection wire.

13. The display apparatus of claim 12, wherein an upper surface of the second layer is inclined on the second organic layer.

14. The display apparatus of claim 1, wherein the second layer is in direct contact with an end of the input sensing layer and an end of the first layer to cover the end of the input sensing layer and the end of the first layer.

15. The display apparatus of claim 1, wherein an upper surface of the second layer is flat on the display area.

16. The display apparatus of claim 1, further comprising:
   a black matrix arranged on the peripheral area and exposing the pad portion; and
   a color filter between the input sensing layer and the optical functional layer,
   wherein the color filter extends toward the peripheral area to be between the black matrix and the second layer.

17. The display apparatus of claim 16, wherein the optical functional layer further comprises a third layer between the first layer and the color filter.

18. The display apparatus of claim 17, wherein the third layer comprises a same material as a material included in the first layer.

19. The display apparatus of claim 16, further comprising a control dam arranged to correspond to the peripheral area between the bending area and the pad portion,
   wherein the control dam is arranged on an edge of the color filter arranged on the black matrix.

20. The display apparatus of claim 1, further comprising:
   a black matrix arranged on the peripheral area and exposing the pad portion; and
   a wavelength adjustment layer between the input sensing layer and the black matrix to correspond to the display area.

21. The display apparatus of claim 20, further comprising a control dam arranged to correspond to the peripheral area between the bending area and the pad portion,
   wherein the control dam is arranged on an edge of the black matrix.

22. The display apparatus of claim 20, wherein the second layer is in direct contact with the black matrix, on the peripheral area.

23. The display apparatus of claim 20, wherein the wavelength adjustment layer extends toward the peripheral area to be between the black matrix and the second layer.

24. The display apparatus of claim 23, further comprising a control dam arranged to correspond to the peripheral area between the bending area and the pad portion,
   wherein the control dam is arranged on an edge of the wavelength adjustment layer.

25. The display apparatus of claim 20, wherein the second layer is in direct contact with the wavelength adjustment layer, on the peripheral area.

\* \* \* \* \*